United States Patent
Lee et al.

(10) Patent No.: US 12,354,961 B2
(45) Date of Patent: Jul. 8, 2025

(54) SEMICONDUCTOR STRUCTURE AND MANUFACTURING METHOD THEREOF

(71) Applicant: Powerchip Semiconductor Manufacturing Corporation, Hsinchu (TW)

(72) Inventors: Shih-Ping Lee, Hsinchu (TW); Mao-Hsing Chiu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 436 days.

(21) Appl. No.: 18/156,339

(22) Filed: Jan. 18, 2023

(65) Prior Publication Data

US 2024/0234323 A1 Jul. 11, 2024

(30) Foreign Application Priority Data

Jan. 9, 2023 (TW) ................. 112100861

(51) Int. Cl.
*H01L 23/535* (2006.01)
*H01L 21/768* (2006.01)
*H01L 23/48* (2006.01)

(52) U.S. Cl.
CPC ...... *H01L 23/535* (2013.01); *H01L 21/76805* (2013.01); *H01L 21/76831* (2013.01);
(Continued)

(58) Field of Classification Search
CPC ............. H01L 23/535; H01L 21/76805; H01L 21/76831; H01L 21/76895;
(Continued)

(56) References Cited

U.S. PATENT DOCUMENTS

| | | |
|---|---|---|
| 9,941,249 B2 | 4/2018 | Tsai et al. |
| 10,629,568 B2 | 4/2020 | Ho et al. |

(Continued)

FOREIGN PATENT DOCUMENTS

TW 202201541 1/2022

OTHER PUBLICATIONS

"Office Action of Taiwan Counterpart Application", issued on Nov. 7, 2023, p. 1-p. 4.

(Continued)

*Primary Examiner* — Mohammad A Rahman
(74) *Attorney, Agent, or Firm* — JCIPRNET

(57) ABSTRACT

A semiconductor structure including the following components is provided. A first device structure includes a first substrate, a first dielectric structure, a first landing pad, and a first capping layer. A second device structure is disposed on the first device structure. The second device structure includes a second substrate, a second dielectric structure, a stop layer, and a second landing pad. The thickness of the stop layer is greater than the thickness of the first capping layer. A first TSV structure is disposed in the second substrate, the second dielectric structure, and the first dielectric structure. The first TSV structure passes through the first capping layer and is electrically connected to the first landing pad. A second TSV structure is disposed in the second substrate and the second dielectric structure. The second TSV structure passes through the stop layer and is electrically connected to the second landing pad.

20 Claims, 17 Drawing Sheets

(52) U.S. Cl.
CPC .. *H01L 21/76895* (2013.01); *H01L 21/76898* (2013.01); *H01L 23/481* (2013.01)

(58) Field of Classification Search
CPC ............. H01L 21/76898; H01L 23/481; H01L 23/485; H01L 24/03; H01L 24/81; H01L 2224/0231; H01L 2224/02331; H01L 2224/02333; H01L 2224/02371; H01L 2224/02381
See application file for complete search history.

(56) References Cited

U.S. PATENT DOCUMENTS

| | | |
|---|---|---|
| 2014/0356981 A1 | 12/2014 | Hubbard et al. |
| 2018/0019187 A1 | 1/2018 | Lagouge et al. |
| 2022/0051968 A1 | 2/2022 | Wu |
| 2022/0359646 A1 | 11/2022 | Kao et al. |
| 2023/0369210 A1* | 11/2023 | Shih ................. H01L 21/76898 |

OTHER PUBLICATIONS

Y. Li; et al., "TSV process-induced MOS reliability degradation," 2018 IEEE International Reliability Physics Symposium (IRPS), Burlingame, CA, USA, Mar. 2018, pp. 1-5.

* cited by examiner

SEMICONDUCTOR STRUCTURE AND MANUFACTURING METHOD THEREOF

CROSS-REFERENCE TO RELATED APPLICATION

This application claims the priority benefit of Taiwan application serial no. 112100861, filed on Jan. 9, 2023. The entirety of the above-mentioned patent application is hereby incorporated by reference herein and made a part of this specification.

BACKGROUND

Technical Field

The invention relates to a semiconductor structure and a manufacturing method thereof, and particularly relates to a semiconductor structure having through-substrate via (TSV) structures and a manufacturing method thereof.

Description of Related Art

In some semiconductor processes, the dielectric layers on the two substrates are bonded, and then the TSV structures are formed. Each of the TSV structures is electrically connected to the corresponding landing pad. The method of forming the TSV structures may include the following steps. First, openings for accommodating the TSV structures are formed, wherein each of the openings exposes the corresponding landing pad. Then, each of the TSV structures is formed in the corresponding opening. In the dry etching process for forming the openings, since the landing pads on different substrates are at different heights, the landing pad that is exposed first is exposed to the plasma for a longer period of time.

However, since the landing pad that is exposed first is exposed to the plasma for a longer period of time, it is easy to build-up dangerous voltage on the landing pad that is exposed first, resulting in antenna effect. Therefore, the semiconductor device will be damaged, and the yield and reliability of the product are reduced.

SUMMARY

The invention provides a semiconductor structure and a manufacturing method thereof, which can effectively prevent or reduce the antenna effect, thereby improving the yield and reliability of the product.

The invention provides a semiconductor structure, which includes a first device structure, a second device structure, a first TSV structure, and a second TSV structure. The first device structure includes a first substrate, a first dielectric structure, a first landing pad, and a first capping layer. The first dielectric structure is disposed on the first substrate. The first landing pad is disposed in the first dielectric structure. The first capping layer is disposed in the first dielectric structure and on the first landing pad. The second device structure is disposed on the first device structure. The second device structure includes a second substrate, a second dielectric structure, a stop layer, and a second landing pad. The second dielectric structure is disposed on the second substrate. The stop layer is disposed in the second dielectric structure. The thickness of the stop layer is greater than the thickness of the first capping layer. The second landing pad is disposed in the second dielectric structure and on the stop layer. The first TSV structure is disposed in the second substrate, the second dielectric structure, and the first dielectric structure. The first TSV structure passes through the first capping layer and is electrically connected to the first landing pad. The second TSV structure is disposed in the second substrate and the second dielectric structure. The second TSV structure passes through the stop layer and is electrically connected to the second landing pad.

According to an embodiment of the invention, in the semiconductor structure, the thickness of the stop layer may be 2 to 5 times the thickness of the first capping layer.

According to an embodiment of the invention, in the semiconductor structure, the second dielectric structure may be bonded to the first dielectric structure.

According to an embodiment of the invention, in the semiconductor structure, the first landing pad may be located between the first capping layer and the first substrate. The stop layer may be located between the second landing pad and the second substrate.

According to an embodiment of the invention, in the semiconductor structure, the first TSV structure may have a protruding portion. The protruding portion may protrude toward the first capping layer.

According to an embodiment of the invention, in the semiconductor structure, the second TSV structure may have a protruding portion. The protruding portion may protrude towards the stop layer.

According to an embodiment of the invention, in the semiconductor structure, the second device structure may further include a second capping layer. The second capping layer is disposed in the second dielectric structure and on the second landing pad.

According to an embodiment of the invention, in the semiconductor structure, the second landing pad may be located between the second capping layer and the second substrate.

According to an embodiment of the invention, in the semiconductor structure, the thickness of the stop layer may be greater than the thickness of the second capping layer.

According to an embodiment of the invention, in the semiconductor structure, the thickness of the stop layer may be 2 to 5 times the thickness of the second capping layer.

According to an embodiment of the invention, in the semiconductor structure, the first TSV structure may have a protruding portion. The protruding portion may protrude toward the second capping layer.

According to an embodiment of the invention, the semiconductor structure may further include a liner dielectric layer. The liner dielectric layer is located between the first TSV structure and the second substrate, between the first TSV structure and the second dielectric structure, between the first TSV structure and the first dielectric structure, between the first TSV structure and the first capping layer, between the second TSV structure and the second substrate, between the second TSV structure and the second dielectric structure, and between the second TSV structure and the stop layer.

The invention provides a manufacturing method of a semiconductor structure, which includes the following steps. A first device structure is provided. The first device structure includes a first substrate, a first dielectric structure, a first landing pad, and a capping layer. The first dielectric structure is disposed on the first substrate. The first landing pad is disposed in the first dielectric structure. The capping layer is disposed in the first dielectric structure and on the first landing pad. A second device structure is provided on the first device structure. The second device structure includes a second substrate, a second dielectric structure, a stop layer, and a second landing pad. The second dielectric structure is disposed on the second substrate. The stop layer is disposed in the second dielectric structure. The thickness of the stop layer is greater than the thickness of the capping layer. The second landing pad is disposed in the second dielectric structure and on the stop layer. A first TSV structure is formed. The first TSV structure is disposed in the second substrate, the second dielectric structure, and the first dielectric structure. The first TSV structure passes through the capping layer and is electrically connected to the first landing pad. A second TSV structure is formed. The second TSV structure is disposed in the second substrate and the second dielectric structure. The second TSV structure passes through the stop layer and is electrically connected to the second landing pad.

According to an embodiment of the invention, in the manufacturing method of the semiconductor structure, the method of providing the second device structure on the first device structure may include bonding the second dielectric structure to the first dielectric structure.

According to an embodiment of the invention, in the manufacturing method of the semiconductor structure, the method of forming the first TSV structure and the second TSV structure may include the following steps. A first opening exposing the capping layer is formed in the second substrate, the second dielectric structure, and the first dielectric structure, and a second opening exposing the stop layer is formed in the second substrate and the second dielectric structure. A portion of the capping layer is removed so that the first opening exposes the first landing pad, and a portion of the stop layer is removed so that the second opening exposes the second landing pad. The first TSV structure is formed in the first opening, and the second TSV structure is formed in the second opening.

According to an embodiment of the invention, in the manufacturing method of the semiconductor structure, the method of forming the first opening and the second opening may include the following steps. A patterned photoresist layer is formed on the second substrate. A dry etching process is performed on the second substrate, the second dielectric structure, and the first dielectric structure by using the patterned photoresist layer as a mask to form the first opening exposing the capping layer, and the dry etching process is performed on the second substrate and the second dielectric structure by using the patterned photoresist layer as a mask to form the second opening exposing the stop layer.

According to an embodiment of the invention, in the manufacturing method of the semiconductor structure, the method of removing the portion of the capping layer and the portion of the stop layer may include performing a wet etching process on the portion of the capping layer exposed by the first opening and the portion of the stop layer exposed by the second opening.

According to an embodiment of the invention, in the manufacturing method of the semiconductor structure, after performing the wet etching process, the capping layer exposed by the first opening may have a first recess, and the stop layer exposed by the second opening may have a second recess. The first TSV structure may have a first protruding portion protruding toward the first recess, and the second TSV structure may have a second protruding portion protruding toward the second recess.

According to an embodiment of the invention, in the manufacturing method of the semiconductor structure, the method of removing the portion of the capping layer and the portion of the stop layer may include performing a dry etching process on the portion of the capping layer exposed by the first opening and the portion of the stop layer exposed by the second opening.

According to an embodiment of the invention, the manufacturing method of the semiconductor structure may further include the following step. A liner dielectric layer is formed on a sidewall of the first opening and a sidewall of the second opening before forming the first TSV structure and the second TSV structure.

Based on the above description, in the semiconductor structure and the manufacturing method thereof according to the invention, the first TSV structure is disposed in the second substrate, the second dielectric structure, and the first dielectric structure. The first TSV structure passes through the capping layer and is electrically connected to the first landing pad. The second TSV structure is disposed in the second substrate and the second dielectric structure. The second TSV structure passes through the stop layer and is electrically connected to the second landing pad. In addition, the thickness of the stop layer is greater than the thickness of the capping layer. Therefore, in the process of forming the openings for accommodating the first TSV structure and the second TSV structure, the antenna effect can be effectively prevented or reduced. In this way, the antenna effect can be prevented from damaging the semiconductor device in the semiconductor structure, thereby improving the yield and reliability of the product.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1L are cross-sectional views illustrating a manufacturing process of a semiconductor structure according to some embodiments of the invention. In addition, in FIG. 1L, enlarged views of the region A, the region B, and the region C are drawn.

Figure 1A:
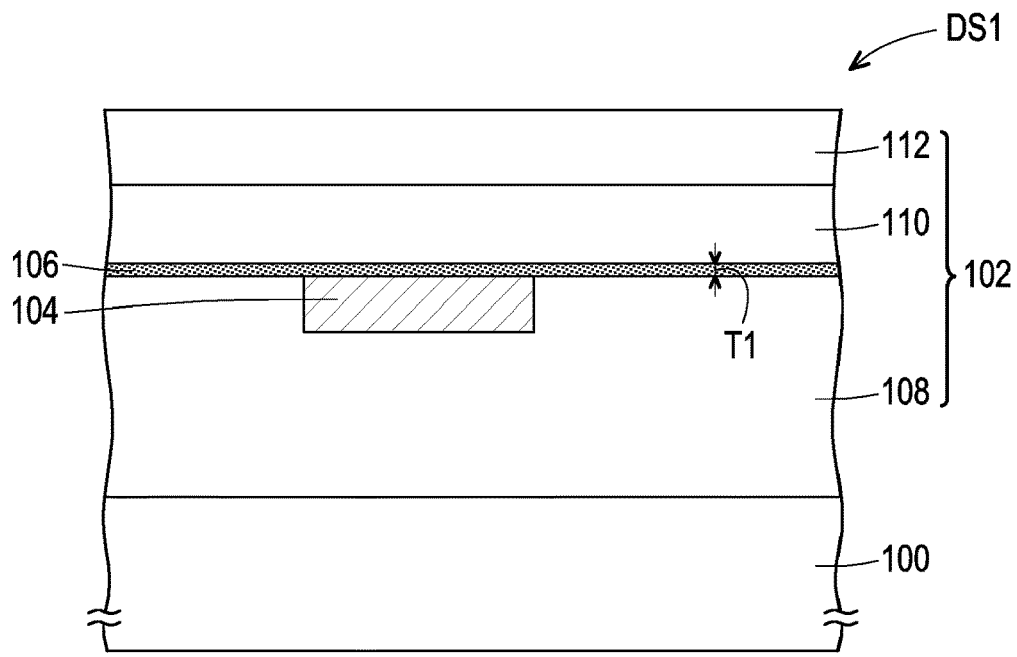
FIG. 1A to FIG. 1L are cross-sectional views illustrating a manufacturing process of a semiconductor structure according to some embodiments of the invention.

Referring to FIG. 1A, a device structure DS1 is provided. The device structure DS1 includes a substrate 100, a dielectric structure 102, a landing pad 104, and a capping layer 106. In some embodiments, the substrate 100 may be a semiconductor substrate such as a silicon substrate. In addition, although not shown in the figure, the substrate 100 may have required components (e.g., doped regions and/or transistors) therein or thereon, and the description thereof is omitted here.

The dielectric structure 102 is disposed on the substrate 100. In some embodiments, the dielectric structure 102 may be a multilayer structure. In the present embodiment, the dielectric structure 102 may include a dielectric layer 108, a dielectric layer 110, and a passivation layer 112. In some embodiments, the dielectric layer 108 may be a multilayer structure. In some embodiments, the material of the dielectric layer 108 is, for example, silicon oxide, a low dielectric constant (low-k) material, or a combination thereof. In addition, although not shown in the figure, the dielectric layer 108 may have required components (e.g., semiconductor devices and/or interconnection structures) therein, and the description thereof is omitted here. In some embodiments, the semiconductor devices may include active devices, passive devices, or a combination thereof. The dielectric layer 110 is disposed on the dielectric layer 108. In some embodiments, the material of the dielectric layer 110 is, for example, silicon oxide or a low-k material. The passivation layer 112 is disposed on the dielectric layer 110. In some embodiments, the material of the passivation layer 112 is, for example, a dielectric material such as silicon oxide.

The landing pad 104 is disposed in the dielectric structure 102. The landing pad 104 may be a single-layer structure or a multilayer structure. In some embodiments, the material of the landing pad 104 is, for example, copper, tantalum, tantalum nitride, aluminum, titanium, titanium nitride, or a combination thereof.

The capping layer 106 is disposed in the dielectric structure 102 and on the landing pad 104. The capping layer 106 may have a thickness T1. In some embodiments, the capping layer 106 may be located between the dielectric layer 108 and the dielectric layer 110. In some embodiments, the material of the capping layer 106 is, for example, nitride (e.g., silicon carbonitride (SiCN) or silicon nitride).

Figure 1B:
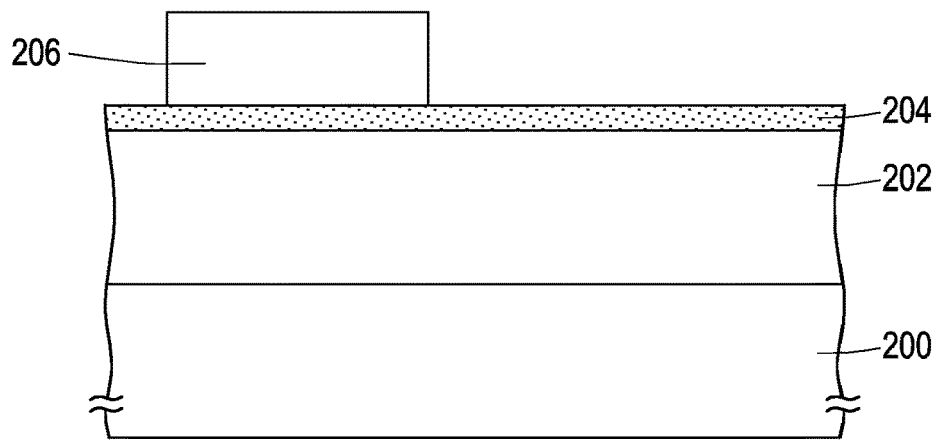

Referring to FIG. 1B, a substrate 200 may be provided. In some embodiments, the substrate 200 may be a semiconductor substrate such as a silicon substrate. In addition, although not shown in the figure, the substrate 200 may have required components (e.g., doped regions and/or transistors) therein or thereon, and the description thereof is omitted here.

A dielectric layer 202 may be formed on the substrate 200. In some embodiments, the dielectric layer 202 may be a multilayer structure. In some embodiments, the material of the dielectric layer 202 is, for example, silicon oxide, a low-k material, or a combination thereof. In addition, although not shown in the figure, the dielectric layer 202 may have required components (e.g., semiconductor devices and/or interconnection structures) therein, and the description thereof is omitted here. In some embodiments, the semiconductor devices may include active devices, passive devices, or a combination thereof. In some embodiments, the dielectric layer 202 may be formed by a front end of line (FEOL) process and a back end of line (BEOL) process.

A stop material layer 204 may be formed on the dielectric layer 202. In some embodiments, the material of the stop material layer 204 is, for example, nitride (e.g., silicon carbonitride or silicon nitride). In some embodiments, the method of forming the stop material layer 204 is, for example, a chemical vapor deposition (CVD) method.

A patterned photoresist layer 206 may be formed on the stop material layer 204. In some embodiments, the patterned photoresist layer 206 may be formed by a lithography process.

Figure 1C:
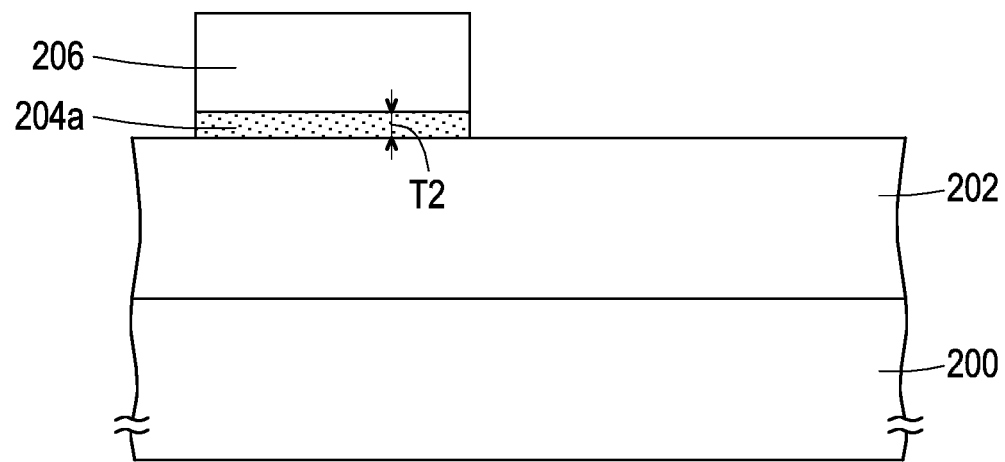

Referring to FIG. 1C, the stop material layer 204 may be patterned by using the patterned photoresist layer 206 as a mask to form a stop layer 204a. In some embodiments, a portion of the stop material layer 204 may be removed by using the patterned photoresist layer 206 as a mask to pattern the stop material layer 204 and to form the stop layer 204a. In some embodiments, the method of removing the portion of the stop material layer 204 is, for example, a dry etching method.

The stop layer 204a may be disposed on the dielectric layer 202. The thickness T2 of the stop layer 204a is greater than the thickness T1 of the capping layer 106. In some embodiments, the thickness T2 of the stop layer 204a may be 2 to 5 times the thickness T1 of the capping layer 106. In some embodiments, the material of the stop layer 204a is, for example, nitride (e.g., silicon carbonitride or silicon nitride).

Figure 1D:
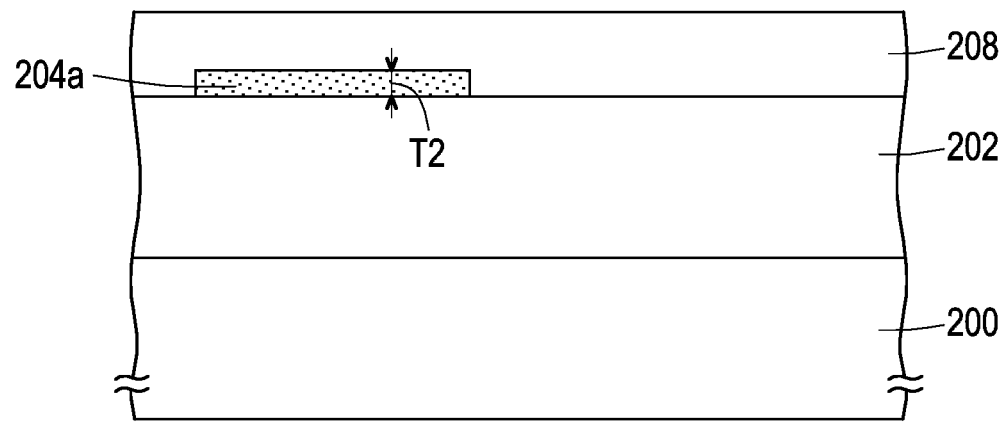

Referring to FIG. 1D, the patterned photoresist layer 206 may be removed. In some embodiments, the method of removing the patterned photoresist layer 206 is, for example, a dry stripping method or a wet stripping method.

A dielectric layer 208 may be formed on the dielectric layer 202 and the stop layer 204a. The material of the dielectric layer 208 is, for example, silicon oxide or a low-k material. In some embodiments, the method of forming the dielectric layer 208 is, for example, a CVD method.

Figure 1E:
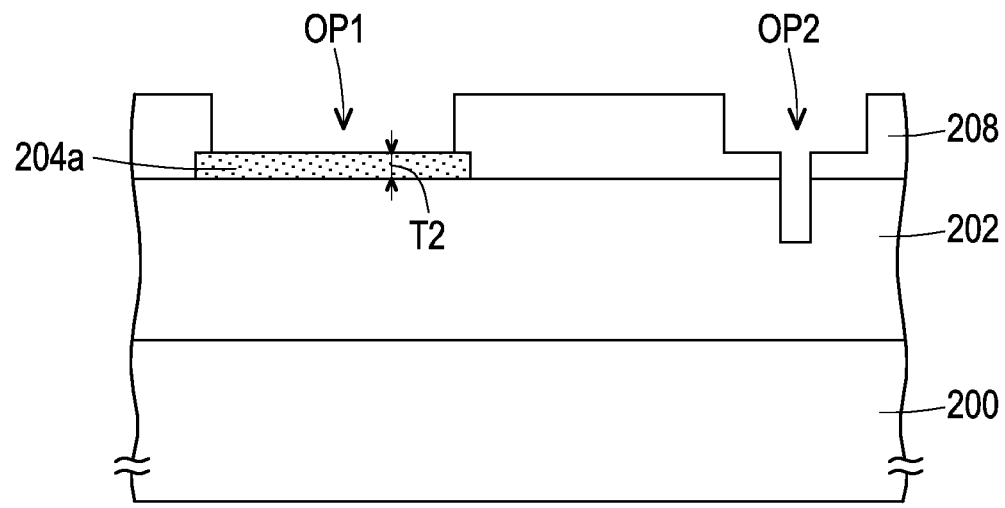
Figure 1F:
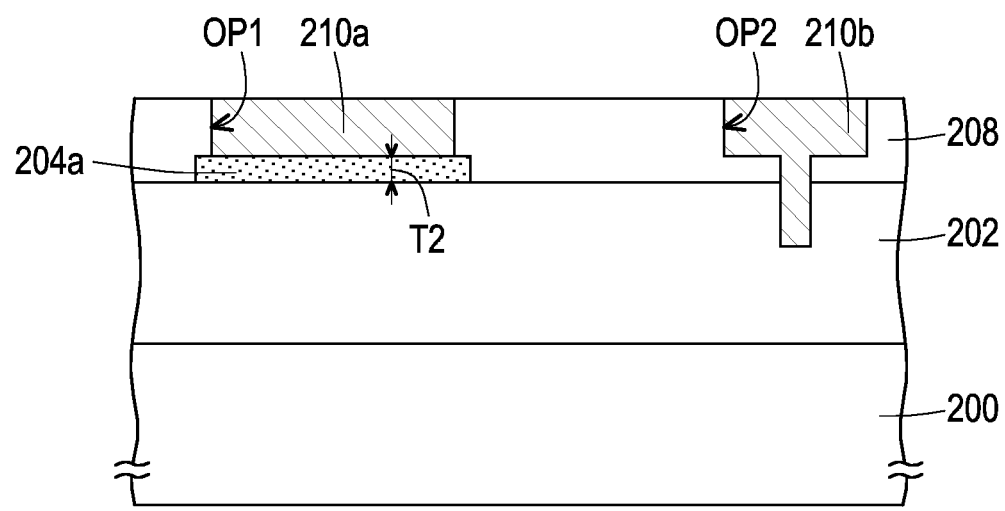

Referring to FIG. 1E and FIG. 1F, a landing pad 210a may be formed in the dielectric layer 208 and on the stop layer 204a. The landing pad 210a may have a single-layer structure or a multilayer structure. In some embodiments, the material of the landing pad 210a is, for example, copper, tantalum, tantalum nitride, or a combination thereof. In addition, a conductive layer 210b may be formed in the dielectric layer 208 and the dielectric layer 202. The conductive layer 210b may be a single-layer structure or a multilayer structure. In some embodiments, the material of the conductive layer 210b is, for example, copper, tantalum, tantalum nitride, or a combination thereof.

In some embodiments, the landing pad 210a and the conductive layer 210b may be formed by a damascene process. For example, the method of forming the landing pad 210a and the conductive layer 210b may include the following steps. First, referring to FIG. 1E, an opening OP1 may be formed in the dielectric layer 208, and an opening OP2 may be formed in the dielectric layer 208 and the dielectric layer 202. The opening OP1 may expose the stop layer 204a. In some embodiments, in the etching process (e.g., dry etching process) for forming the opening OP1, the stop layer 204a may be used as an etching stop layer. In some embodiments, the opening OP1 may be a single damascene opening, and the opening OP2 may be a dual damascene opening. Then, referring to FIG. 1F, the landing pad 210a may be formed in the opening OP1, and the conductive layer 210b may be formed in the opening OP2.

Figure 1G:
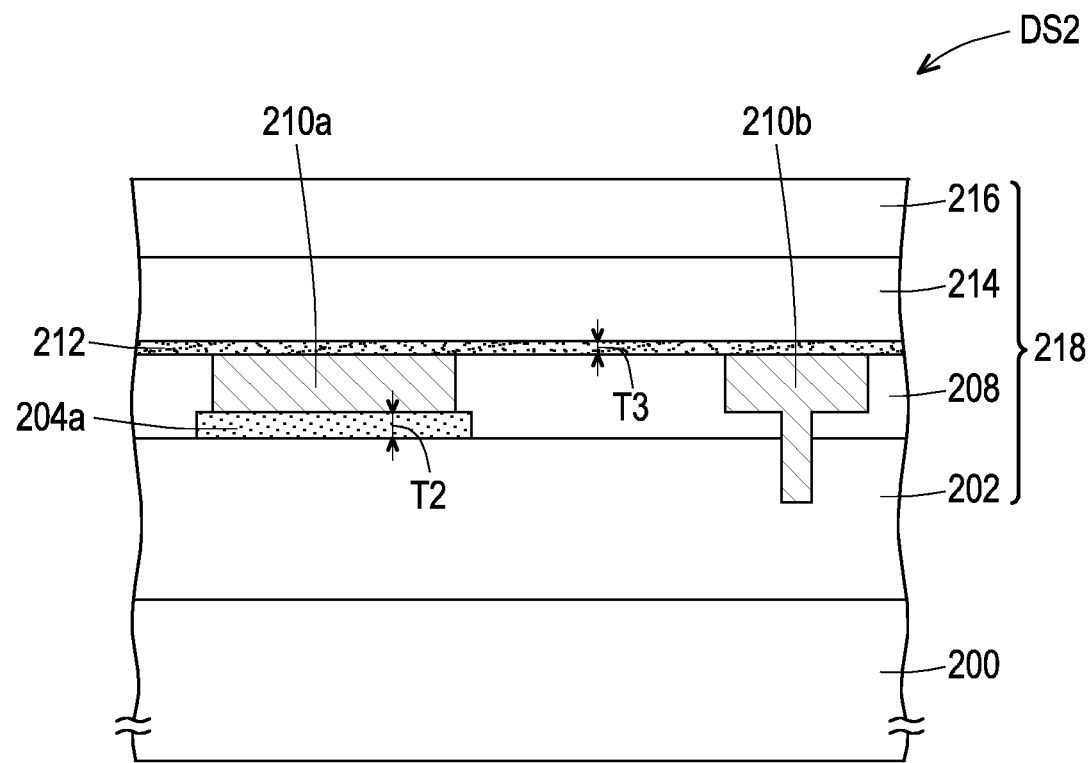

Referring to FIG. 1G, a capping layer 212 may be formed on the dielectric layer 208, the landing pad 210a, and the conductive layer 210b. In some embodiments, the thickness T2 of the stop layer 204a may be greater than the thickness T3 of the capping layer 212. In some embodiments, the thickness T2 of the stop layer 204a may be 2 to 5 times the thickness T3 of the capping layer 212. In some embodiments, the material of the capping layer 212 is, for example, nitride (e.g., silicon carbonitride or silicon nitride). In some embodiments, the method of forming the capping layer 212 is, for example, a CVD method.

A dielectric layer 214 may be formed on the capping layer 212. In some embodiments, the material of the dielectric layer 214 is, for example, silicon oxide or a low-k material. In some embodiments, the method of forming the dielectric layer 214 is, for example, a CVD method.

A passivation layer 216 may be formed on the dielectric layer 214. The material of the passivation layer 216 is, for example, a dielectric material such as silicon oxide. In some embodiments, the method of forming the passivation layer 216 is, for example, a CVD method.

In some embodiments, a device structure DS2 may be formed by the above method. The device structure DS2 includes a substrate 200, a dielectric structure 218, a stop layer 204a, and a landing pad 210a. The dielectric structure 218 is disposed on the substrate 200. In some embodiments, the dielectric structure 218 may be a multilayer structure. In some embodiments, the dielectric structure 218 may include a dielectric layer 202, a dielectric layer 208, a dielectric layer 214, and a passivation layer 216. The dielectric layer 202 is disposed on the substrate 200. The dielectric layer 208 is disposed on the dielectric layer 202. The dielectric layer 214 is disposed on the dielectric layer 208. The passivation layer 216 is disposed on the dielectric layer 214. The stop layer 204a is disposed in the dielectric structure 218. The landing pad 210a is disposed in the dielectric structure 218 and on the stop layer 204a.

In some embodiments, the device structure DS2 may further include at least one of a conductive layer 210b and a capping layer 212. The conductive layer 210b is disposed in the dielectric structure 218. The capping layer 212 may be located between the dielectric layer 214 and the landing pad 210a and between the dielectric layer 214 and the conductive layer 210b.

Figure 1H:
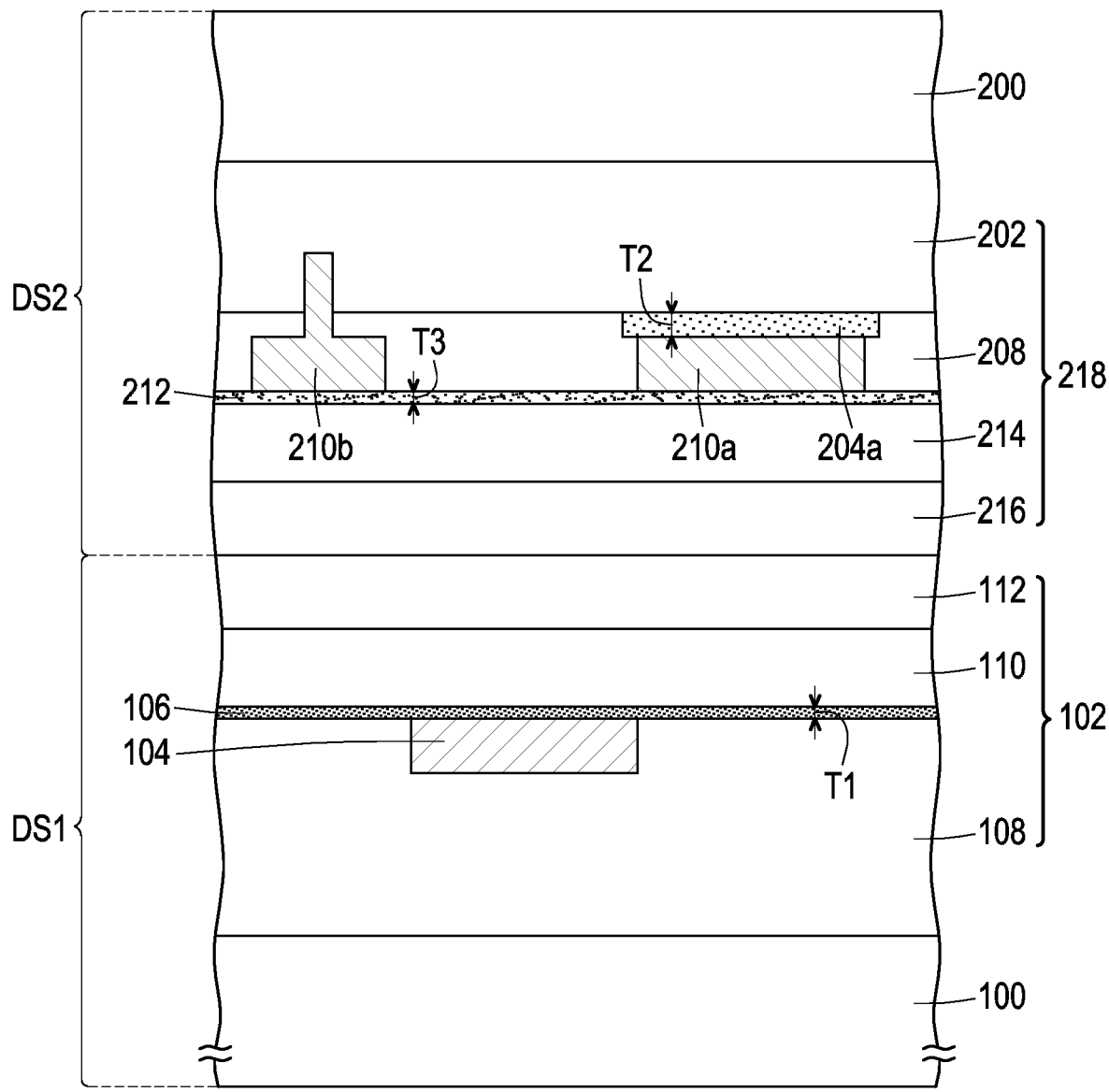

Referring to FIG. 1H, the device structure DS2 is provided on the device structure DS1. In some embodiments, the method of providing the device structure DS2 on the device structure DS1 may include bonding the dielectric structure 218 to the dielectric structure 102. In some embodiments, a method of bonding the dielectric structure 218 to the dielectric structure 102 may include bonding the passivation layer 216 to the passivation layer 112. In some embodiments, the method of bonding the passivation layer 216 to the passivation layer 112 is, for example, a fusion bonding method.

Figure 1I:
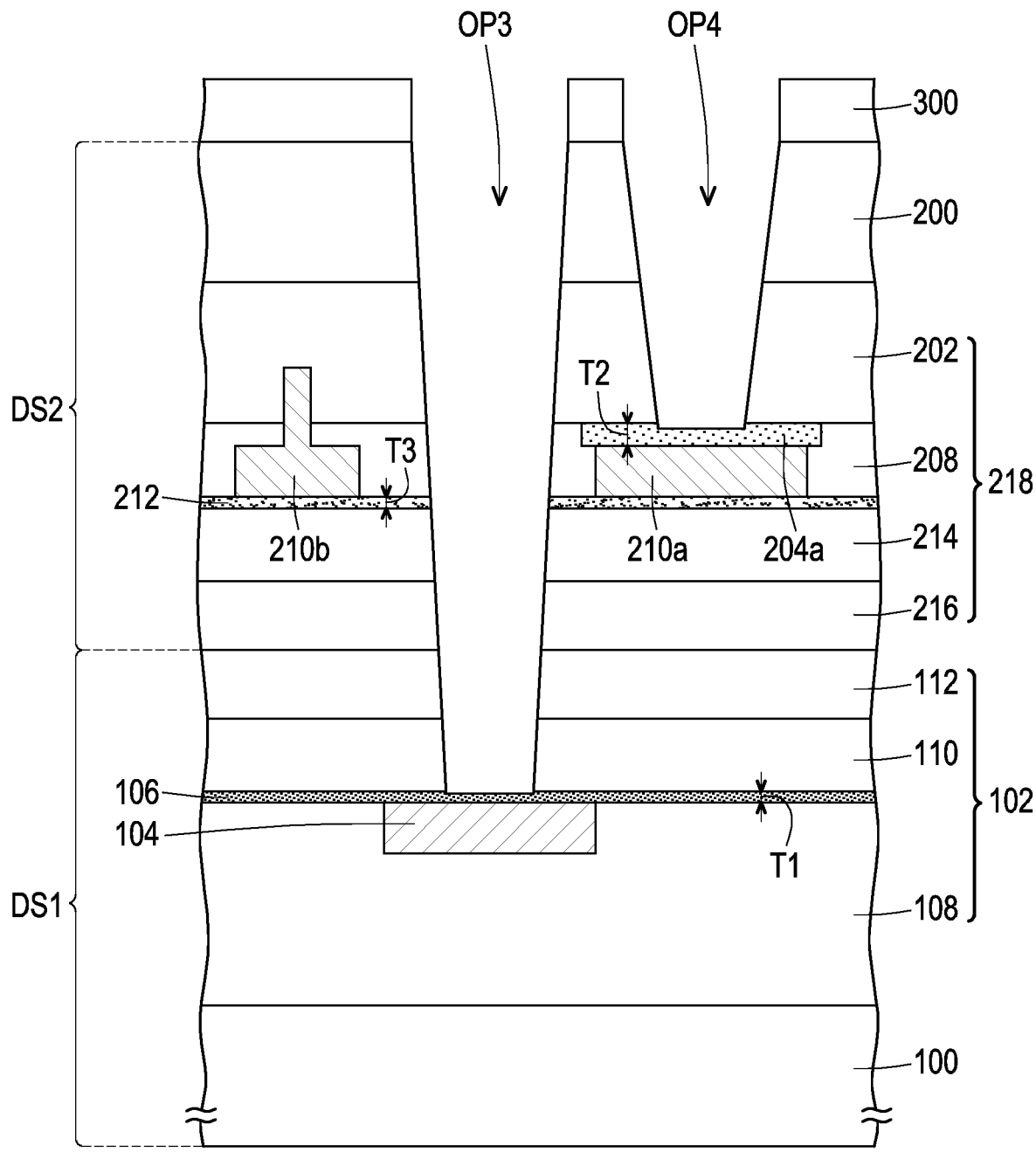

Referring to FIG. 1I, a patterned photoresist layer 300 may be formed on the substrate 200. In some embodiments, the patterned photoresist layer 300 may be formed by a lithography process.

A dry etching process may be performed on the substrate 200, the dielectric structure 218, the capping layer 212, and the dielectric structure 102 by using the patterned photoresist layer 300 as a mask to form an opening OP3 exposing the capping layer 106, and the dry etching process may be performed on the substrate 200 and the dielectric structure 218 by using the patterned photoresist layer 300 as a mask to form an opening OP4 exposing the stop layer 204a. Therefore, the opening OP3 exposing the capping layer 106 may be formed in the substrate 200, the dielectric structure 218, the capping layer 212, and the dielectric structure 102, and the opening OP4 exposing the stop layer 204a may be formed in the substrate 200 and the dielectric structure 218. In some embodiments, the opening OP3 and the opening OP4 may be formed by the same dry etching process. In the dry etching process, the capping layer 106 and the stop layer 204a may be used as etching stop layers, and the thickness T2 of the stop layer 204a is greater than the thickness T1 of the capping layer 106. Therefore, in the dry etching process, the landing pad 104 and the landing pad 210a can be prevented from being exposed to the plasma, thereby effectively preventing the antenna effect.

Figure 1J:
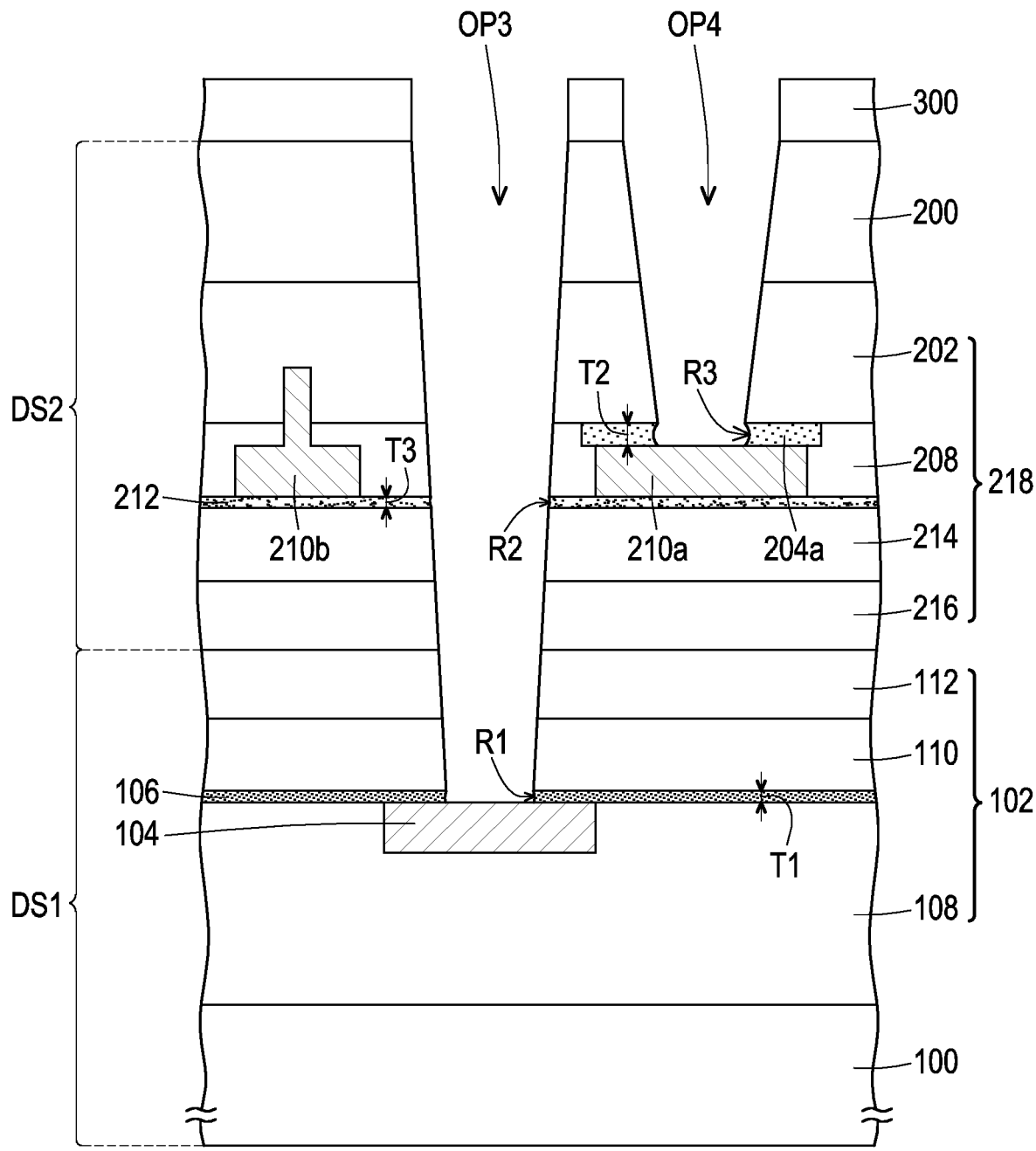

Referring to FIG. 1J, a portion of the capping layer 106 may be removed so that the opening OP3 exposes the landing pad 104, and a portion of the stop layer 204a may be removed so that the opening OP4 exposes the landing pad 210a. In the present embodiment, the method of removing the portion of the capping layer 106 and the portion of the stop layer 204a may include performing a wet etching process on the portion of the capping layer 106 exposed by the opening OP3 and the portion of the stop layer 204a exposed by the opening OP4. In the present embodiment, the portion of the capping layer 106 and the portion of the stop layer 204a are removed by the wet etching process, so the antenna effect will not be generated in the process of removing the portion of the capping layer 106 and the portion of the stop layer 204a. In the present embodiment, after performing the wet etching process, the capping layer 106 exposed by the opening OP3 may have a recess R1, the capping layer 212 exposed by the opening OP3 may have a recess R2, and the stop layer 204a exposed by the opening OP4 may have a recess R3.

In other embodiments, the method of removing the portion of the capping layer 106 and the portion of the stop layer 204a may include performing a dry etching process on the portion of the capping layer 106 exposed by the opening OP3 and the portion of the stop layer 204a exposed by the opening OP4. In other embodiments, although not shown in the figure, when the portion of the capping layer 106 and the portion of the stop layer 204a are removed by the dry etching process, the capping layer 106 may not have the recess R1, the capping layer 212 may not have the recess R2, and the stop layer 204a may not have the recess R3.

Figure 1K:
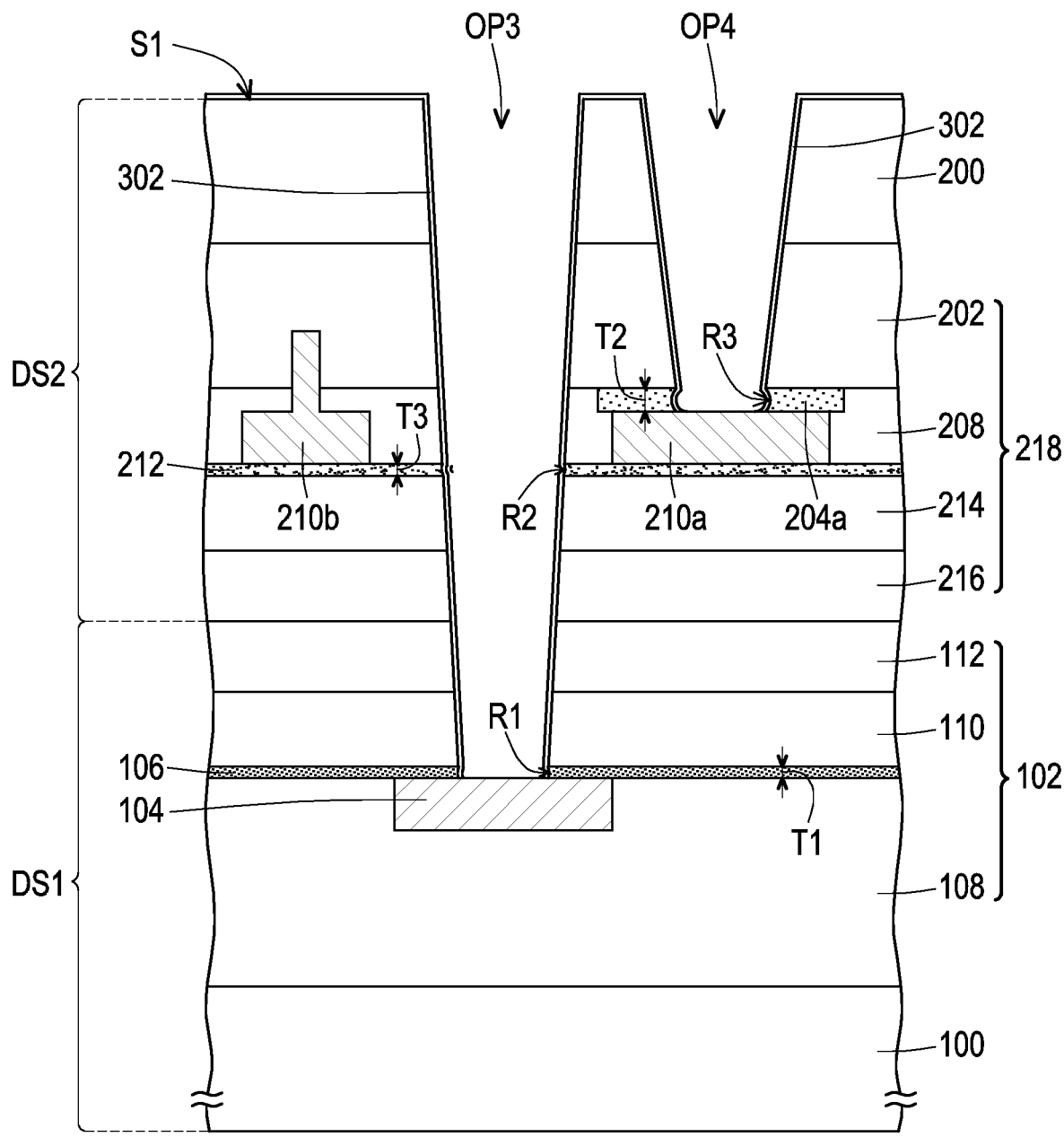

Referring to FIG. 1K, the patterned photoresist layer 300 may be removed. In some embodiments, the method of removing the patterned photoresist layer 300 is, for example, a dry stripping method or a wet stripping method.

A liner dielectric layer 302 may be formed on the sidewall of the opening OP3 and the sidewall of the opening OP4. The liner dielectric layer 302 may expose the landing pad 104 and the landing pad 210a. In some embodiments, the material of the liner dielectric layer 302 is, for example, silicon oxide. In some embodiments, the method of forming the liner dielectric layer 302 may include the following steps. First, a liner dielectric material layer (not shown) may be conformally formed on the substrate 200 and in the opening OP3 and the opening OP4. In some embodiments, the method of forming the lining dielectric material layer is, for example, a CVD method. An etch-back process may be performed on the liner dielectric material layer to remove a portion of the liner dielectric material layer located at the bottom of the opening OP3 and a portion of the liner dielectric material layer located at the bottom of the opening OP4 to form the liner dielectric layer 302. In some embodiments, the etch-back process is, for example, a dry etching process. In some embodiments, the liner dielectric layer 302 may be further located on the surface S1 of the substrate 200. In some embodiments, the liner dielectric layer 302 may be further located in the recess R1 of the capping layer 106, the recess R2 of the capping layer 212, and the recess R3 of the stop layer 204a.

Figure 1L:
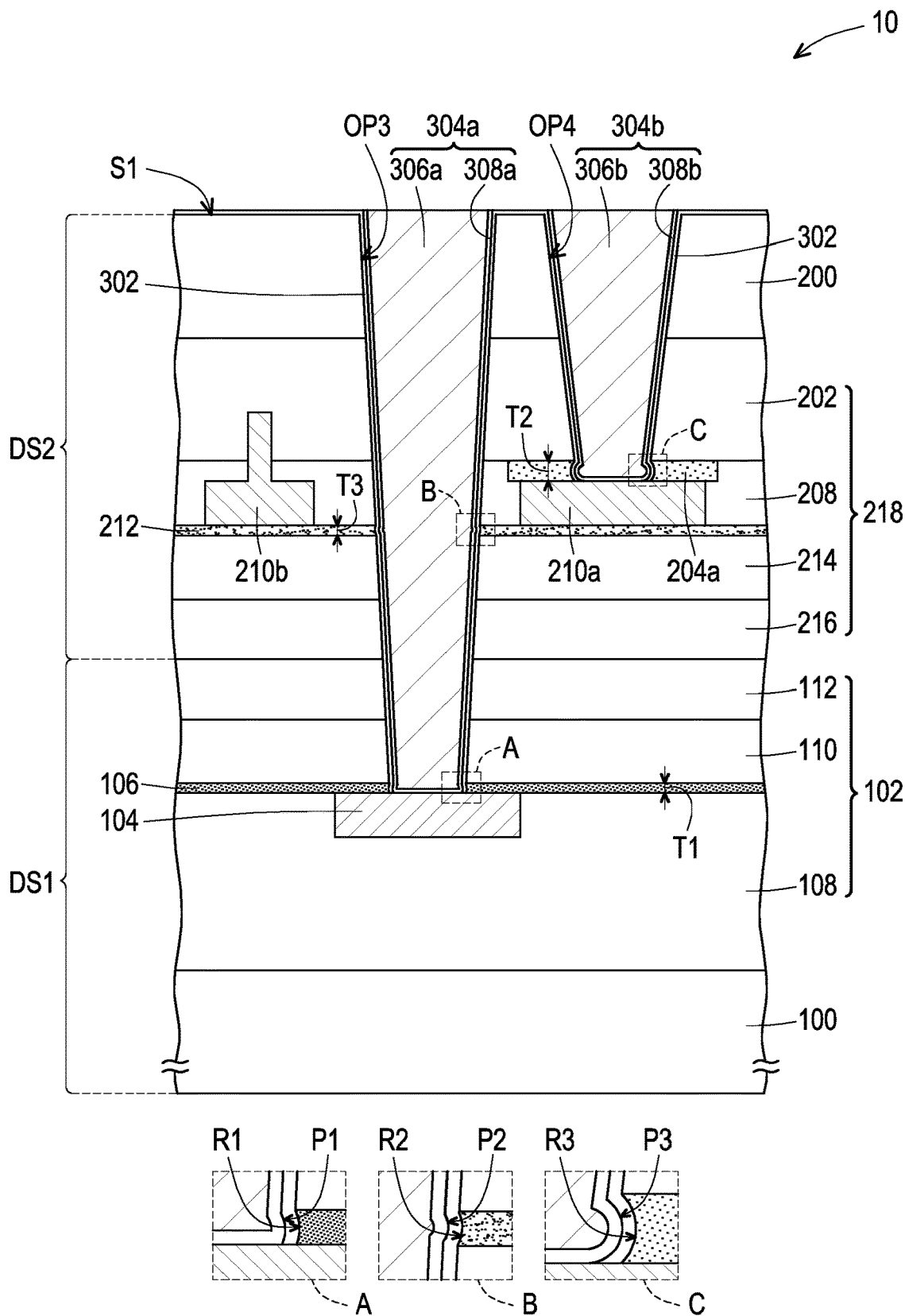

Referring to FIG. 1L, a TSV structure 304a may be formed in the opening OP3, and a TSV structure 304b may be formed in the opening OP4. The TSV structure 304a is disposed in the substrate 200, the dielectric structure 218, and the dielectric structure 102. In some embodiments, the TSV structure 304a may be further disposed in the capping layer 212. The TSV structure 304a passes through the capping layer 106 and is electrically connected to the landing pad 104. The TSV structure 304b is disposed in the substrate 200 and the dielectric structure 218. The TSV structure 304b passes through the stop layer 204a and is electrically connected to the landing pad 210a. In the present embodiment, the TSV structure 304a may have a protruding portion P1 protruding toward the recess R1, the TSV structure 304a may have a protruding portion P2 protruding toward the recess R2, and the TSV structure 304b may have a protruding portion P3 protruding toward the recess R3.

The TSV structure 304a and the TSV structure 304b may be single-layer structures or multilayer structures. In the present embodiment, the TSV structure 304a and the TSV structure 304b are, for example, multilayer structures, but the invention is not limited thereto. In some embodiments, the TSV structure 304a may include a TSV 306a and a barrier layer 308a. The TSV 306a is located in the opening OP3. The barrier layer 308a may be located between the TSV 306a and the liner dielectric layer 302 and between the TSV 306a and the landing pad 104. In some embodiments, the TSV structure 304b may include a TSV 306b and a barrier layer 308b. The TSV 306b is located in the opening OP4. The barrier layer 308b may be located between the TSV 306b and the liner dielectric layer 302 and between the TSV 306b and the landing pad 210a. In some embodiments, the materials of the TSV 306a and the TSV 306b are conductive materials such as copper. In some embodiments, the materials of the barrier layer 308a and the barrier layer 308b are, for example, tantalum, tantalum nitride, or a combination thereof.

In some embodiments, the method of forming the TSV structure 304a and the TSV structure 304b may include the following steps. First, a barrier material layer (not shown) may be conformally formed in the opening OP3 and the opening OP4. In some embodiments, the barrier material layer may be formed on the liner dielectric layer 302, a portion of the landing pad 104, and a portion of the landing pad 210a. In some embodiments, the method of forming the barrier material layer is, for example, a physical vapor deposition (PVD) method or a CVD method. Then, a TSV material layer (not shown) may be formed on the barrier material layer. The TSV material layer may fill the opening OP3 and the opening OP4. In some embodiments, the method of forming the TSV material layer is, for example, an electroplating method. Then, a portion of the TSV material layer and a portion of the barrier material layer located outside the opening OP3 and outside the opening OP4 may be removed to form the TSV 306a, the TSV 306b, the barrier layer 308a, and the barrier layer 308b. Therefore, the TSV structure 304a may be formed in the opening OP3, and the TSV structure 304b may be formed in the opening OP4. In some embodiments, the method of removing the portion of the TSV material layer and the portion of the barrier material layer located outside the opening OP3 and outside the opening OP4 is, for example, a chemical mechanical polishing (CMP) method.

Hereinafter, the semiconductor structure 10 of the above embodiments will be described with reference to FIG. 1L. In addition, although the method for forming the semiconductor structure 10 is described by taking the above method as an example, the invention is not limited thereto.

Referring to FIG. 1L, the semiconductor structure 10 includes a device structure DS1, a device structure DS2, a TSV structure 304a, and a TSV structure 304b. The device structure DS1 includes a substrate 100, a dielectric structure 102, a landing pad 104, and a capping layer 106. The dielectric structure 102 is disposed on the substrate 100. The landing pad 104 is disposed in the dielectric structure 102. The capping layer 106 is disposed in the dielectric structure 102 and on the landing pad 104. In some embodiments, the landing pad 104 may be located between the capping layer 106 and the substrate 100.

The device structure DS2 is disposed on the device structure DS1. The device structure DS2 includes a substrate 200, a dielectric structure 218, a stop layer 204a, and a landing pad 210a. The dielectric structure 218 is disposed on the substrate 200. In some embodiments, the dielectric structure 218 may be bonded to the dielectric structure 102. The stop layer 204a is disposed in the dielectric structure 218. The thickness T2 of the stop layer 204a is greater than the thickness T1 of the capping layer 106. In some embodiments, the thickness T2 of the stop layer 204a may be 2 to 5 times the thickness T1 of the capping layer 106. The landing pad 210a is disposed in the dielectric structure 218 and on the stop layer 204a. In some embodiments, the stop layer 204a may be located between the landing pad 210a and the substrate 200.

In some embodiments, the device structure DS2 may further include a conductive layer 210b. The conductive layer 210b is disposed in the dielectric structure 218. In some embodiments, the device structure DS2 may further include a capping layer 212. The capping layer 212 is disposed in the dielectric structure 218 and on the landing pad 210a. The capping layer 212 is disposed in the dielectric structure 218 and on the conductive layer 210b. In some embodiments, the landing pad 210a may be located between the capping layer 212 and the substrate 200. In some embodiments, the conductive layer 210b may be located between the capping layer 212 and the substrate 200. In some embodiments, the thickness T2 of the stop layer 204a may be greater than the thickness T3 of the capping layer 212. In some embodiments, the thickness T2 of the stop layer 204a may be 2 to 5 times the thickness T3 of the capping layer 212.

The TSV structure 304a is disposed in the substrate 200, the dielectric structure 218, and the dielectric structure 102. In some embodiments, the TSV structure 304a may be further disposed in the capping layer 212. The TSV structure 304a passes through the capping layer 106 and is electrically connected to the landing pad 104. The TSV structure 304b is disposed in the substrate 200 and the dielectric structure 218. The TSV structure 304b passes through the stop layer 204a and is electrically connected to the landing pad 210a.

In some embodiments, the TSV structure 304a may have a protruding portion P1. The protruding portion P1 may protrude toward the capping layer 106. In some embodiments, the TSV structure 304a may have a protruding portion P2. The protruding portion P2 may protrude toward the capping layer 212. In some embodiments, the TSV structure 304b may have a protruding portion P3. The protruding portion P3 may protrude toward the stop layer 204a.

In some embodiments, the semiconductor structure 10 may further include a liner dielectric layer 302. The liner dielectric layer 302 is located between the TSV structure 304a and the substrate 200, between the TSV structure 304a and the dielectric structure 218, between the TSV structure 304a and the dielectric structure 102, between the TSV structure 304a and the capping layer 106, between the TSV structure 304b and the substrate 200, between the TSV structure 304b and the dielectric structure 218, and between the TSV structure 304b and the stop layer 204a. In some embodiments, the liner dielectric layer 302 may be further located between the TSV structure 304a and the capping layer 212.

In addition, the details (e.g., the material and the forming method) of each component in the semiconductor structure 10 have been described in detail in the above embodiments, and the description thereof is not repeated here.

Based on the above embodiments, in the semiconductor structure 10 and the manufacturing method thereof, the TSV structure 304a is disposed in the substrate 200, the dielectric structure 218, and the dielectric structure 102. The TSV structure 304a passes through the capping layer 106 and is electrically connected to the landing pad 104. The TSV structure 304b is disposed in the substrate 200 and the dielectric structure 218. The TSV structure 304b passes through the stop layer 204a and is electrically connected to the landing pad 210a. In addition, the thickness T2 of the stop layer 204a is greater than the thickness T1 of the capping layer 106. Therefore, in the process of forming the openings (e.g., opening OP3 and opening OP4) for accommodating the TSV structure 304a and the TSV structure 304b, the antenna effect can be effectively prevented or reduced. In this way, the antenna effect can be prevented from damaging the semiconductor device in the semiconductor structure 10, thereby improving the yield and reliability of the product.

FIG. 2A to FIG. 2J are cross-sectional views illustrating a manufacturing process of a semiconductor structure according to other embodiments of the invention. In addition, in FIG. 2J, enlarged views of the region D and the region E are drawn.

Figure 2A:
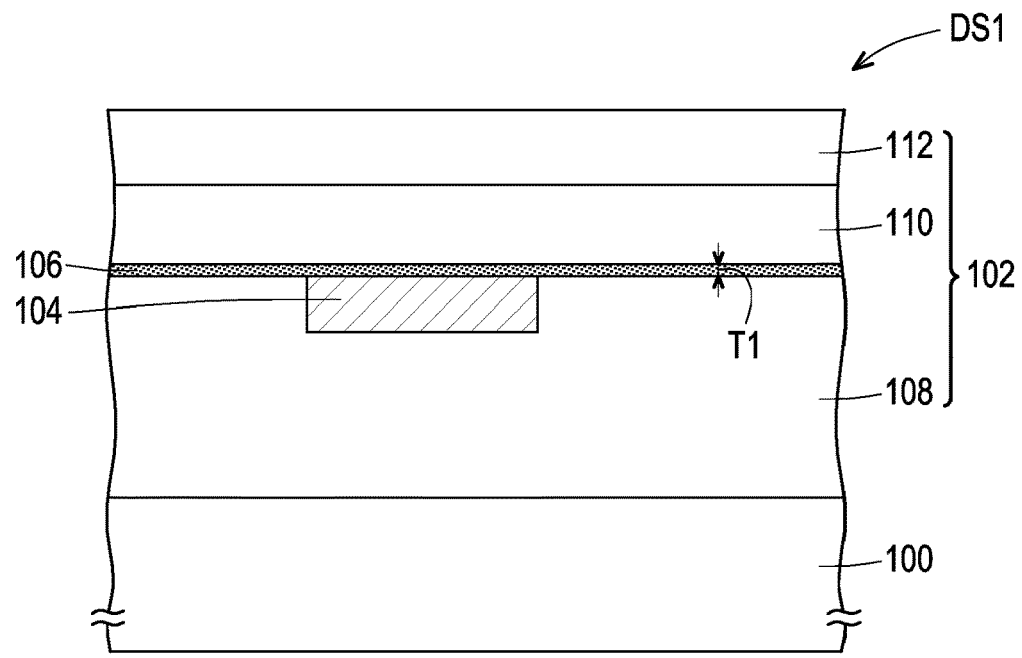
FIG. 2A to FIG. 2J are cross-sectional views illustrating a manufacturing process of a semiconductor structure according to other embodiments of the invention.

Referring to FIG. 2A, the device structure DS1 as shown in FIG. 1A is provided. In addition, the details (e.g., the arrangement and the material) of each component in the device structure DS1 have been described in detail in the above embodiments, and the description thereof is not repeated here.

Figure 2B:
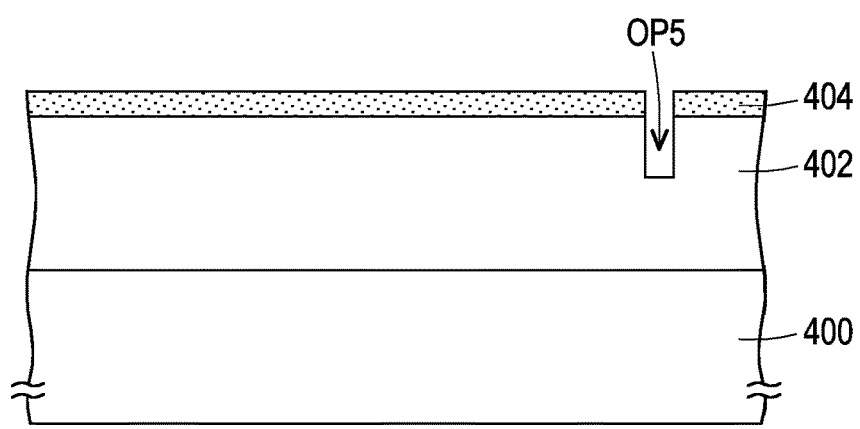

Referring to FIG. 2B, a substrate 400 may be provided. In some embodiments, the substrate 400 may be a semiconductor substrate such as a silicon substrate. In addition, although not shown in the figure, the substrate 400 may have required components (e.g., doped regions and/or transistors) therein or thereon, and the description thereof is omitted here.

A dielectric layer 402 may be formed on the substrate 400. In some embodiments, the dielectric layer 402 may be a multilayer structure. In some embodiments, the material of the dielectric layer 402 is, for example, silicon oxide, a low-k material, or a combination thereof. In addition, although not shown in the figure, the dielectric layer 402 may have required components (e.g., semiconductor devices and/or interconnection structures) therein, and the description thereof is omitted here. In some embodiments, the semiconductor devices may include active devices, passive devices, or a combination thereof. In some embodiments, the dielectric layer 402 may be formed by a front end of line (FEOL) process and a back end of line (BEOL) process.

A stop material layer 404 may be formed on the dielectric layer 402. In some embodiments, the material of the stop material layer 404 is, for example, nitride (e.g., silicon carbonitride or silicon nitride). In some embodiments, the method of forming the stop material layer 404 is, for example, a CVD method.

An opening OP5 may be formed in the stop material layer 404 and the dielectric layer 402. In some embodiments, the stop material layer 404 and the dielectric layer 402 may be patterned by a lithography process and an etching process (e.g., dry etching process) to form the opening OP5.

Figure 2C:
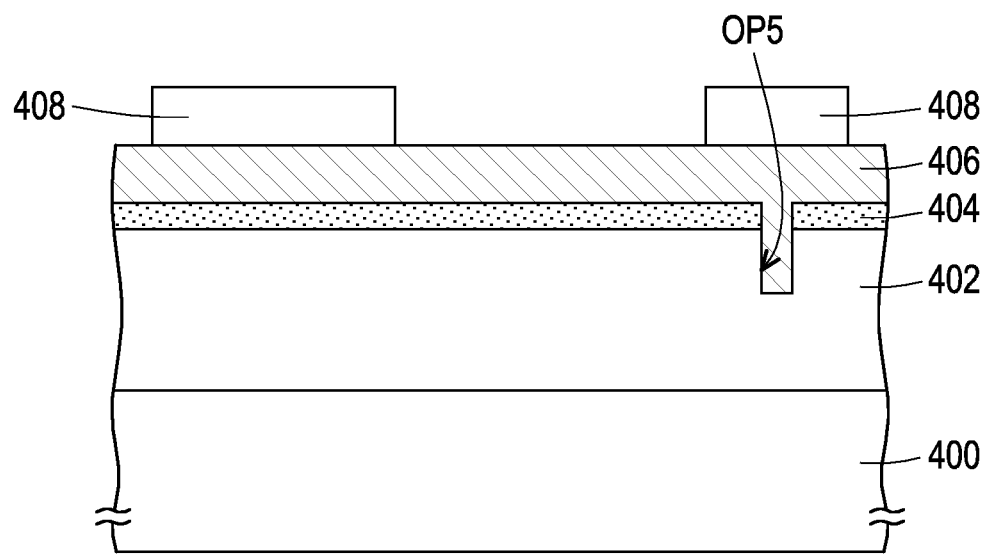

Referring to FIG. 2C, a conductive material layer 406 may be formed on the stop material layer 404. In some embodiments, the conductive material layer 406 may fill the opening OP5. The conductive material layer 406 may be a single-layer structure or a multilayer structure. In some embodiments, the material of the conductive material layer 406 is, for example, aluminum, titanium, titanium nitride, or a combination thereof. In some embodiments, the method of forming the conductive material layer 406 is, for example, a PVD method or a CVD method.

A patterned photoresist layer 408 may be formed on the conductive material layer 406. In some embodiments, the patterned photoresist layer 408 may be formed by a lithography process.

Figure 2D:
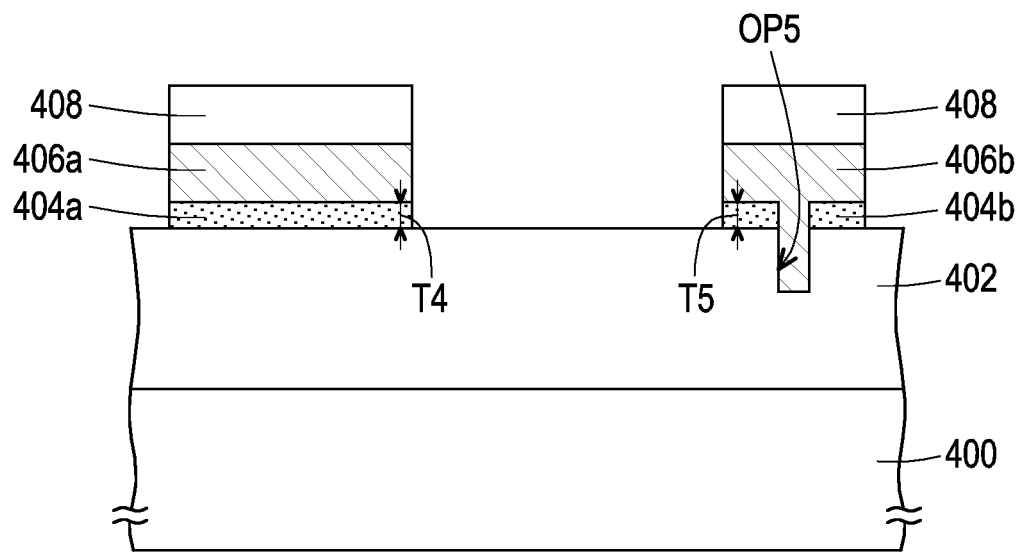

Referring to FIG. 2D, the conductive material layer 406 and the stop material layer 404 may be patterned by using the patterned photoresist layer 408 as a mask to form a landing pad 406a, a conductive layer 406b, a stop layer 404a, and a stop layer 404b. In some embodiments, a portion of the conductive material layer 406 and a portion of the stop material layer 404 may be removed by using the patterned photoresist layer 408 as a mask to pattern the conductive material layer 406 and the stop material layer 404 and to form the landing pad 406a, the conductive layer 406b, the stop layer 404a, and the stop layer 404b. In some embodiments, the method of removing the portion of the conductive material layer 406 and the portion of the stop material layer 404 is, for example, a dry etching method.

The stop layer 404a may be disposed on the dielectric layer 402. The thickness T4 of the stop layer 404a is greater than the thickness T1 of the capping layer 106. In some embodiments, the thickness T4 of the stop layer 404a may be 2 to 5 times the thickness T1 of the capping layer 106. In some embodiments, the material of the stop layer 404a is, for example, nitride (e.g., silicon carbonitride or silicon nitride). The landing pad 406a may be disposed on the stop layer 404a. The landing pad 406a may be a single-layer structure or a multilayer structure. In some embodiments, the material of the landing pad 406a is, for example, aluminum, titanium, titanium nitride, or a combination thereof.

The stop layer 404b may be disposed on the dielectric layer 402. The thickness T5 of the stop layer 404b may be greater than the thickness T1 of the capping layer 106. In some embodiments, the thickness T5 of the stop layer 404b may be 2 times to 5 times the thickness T1 of the capping layer 106. In some embodiments, the material of the stop layer 404b is, for example, nitride (e.g., silicon carbonitride or silicon nitride). The conductive layer 406b may be disposed on the stop layer 404b. The conductive layer 406b may fill the opening OP5. The conductive layer 406b may pass through the stop layer 404b. The conductive layer 406b may be a single-layer structure or a multilayer structure. In some embodiments, the material of the conductive layer 406b is, for example, aluminum, titanium, titanium nitride, or a combination thereof.

Figure 2E:
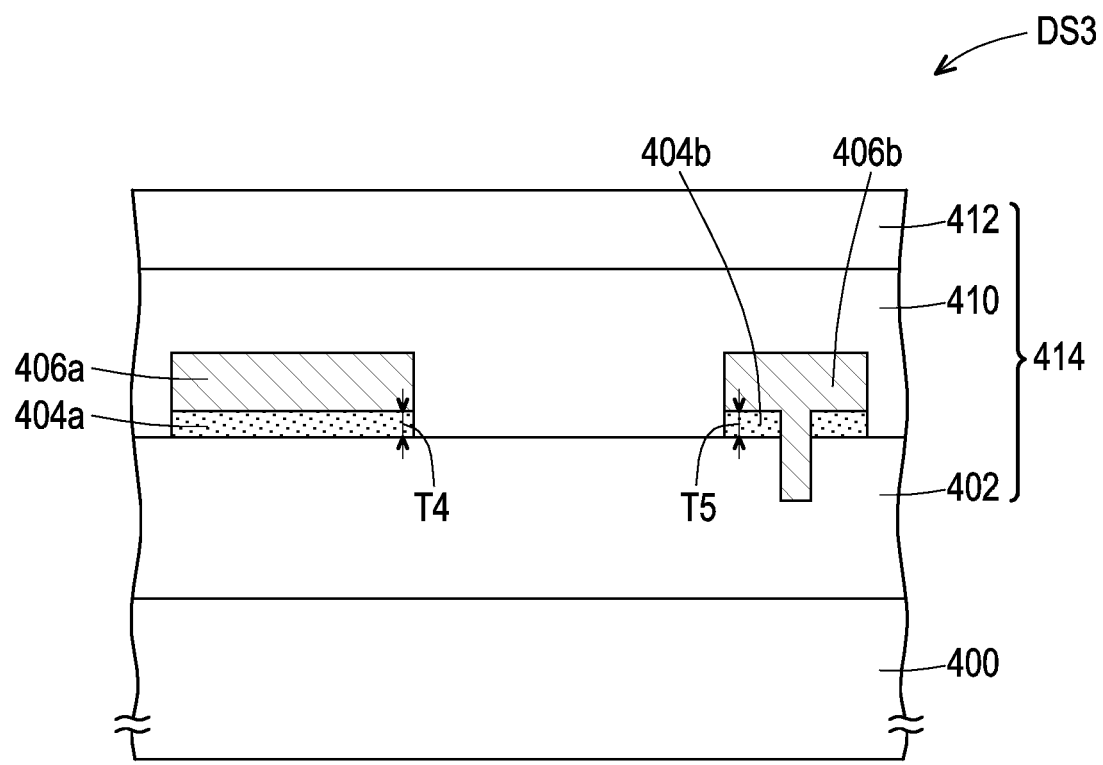

Referring to FIG. 2E, the patterned photoresist layer 408 may be removed. In some embodiments, the method of removing the patterned photoresist layer 408 is, for example, a dry stripping method or a wet stripping method.

A dielectric layer 410 may be formed on the dielectric layer 402, the landing pad 406a, and the conductive layer 406b. In some embodiments, the material of the dielectric layer 410 is, for example, silicon oxide or a low-k material.

In some embodiments, the method of forming the dielectric layer 410 is, for example, a CVD method.

A passivation layer 412 may be formed on the dielectric layer 410. The material of the passivation layer 412 is, for example, a dielectric material such as silicon oxide. In some embodiments, the method of forming the passivation layer 412 is, for example, a CVD method.

In some embodiments, a device structure DS3 may be formed by the above method. The device structure DS3 includes a substrate 400, a dielectric structure 414, a stop layer 404a, and a landing pad 406a. The dielectric structure 414 is disposed on the substrate 400. In some embodiments, the dielectric structure 414 may be a multilayer structure. In some embodiments, the dielectric structure 414 may include a dielectric layer 402, a dielectric layer 410, and a passivation layer 412. The dielectric layer 402 is disposed on the substrate 400. The dielectric layer 410 is disposed on the dielectric layer 402. The passivation layer 412 is disposed on the dielectric layer 410. The stop layer 404a is disposed in the dielectric structure 414. The landing pad 406a is disposed in the dielectric structure 414 and on the stop layer 404a.

In some embodiments, the device structure DS3 may further include at least one of a stop layer 404b and a conductive layer 406b. The stop layer 404b is disposed in the dielectric structure 414. The conductive layer 406b is disposed in the dielectric structure 414 and on the stop layer 404b. In some embodiments, the conductive layer 406b may pass through the stop layer 404b.

Figure 2F:
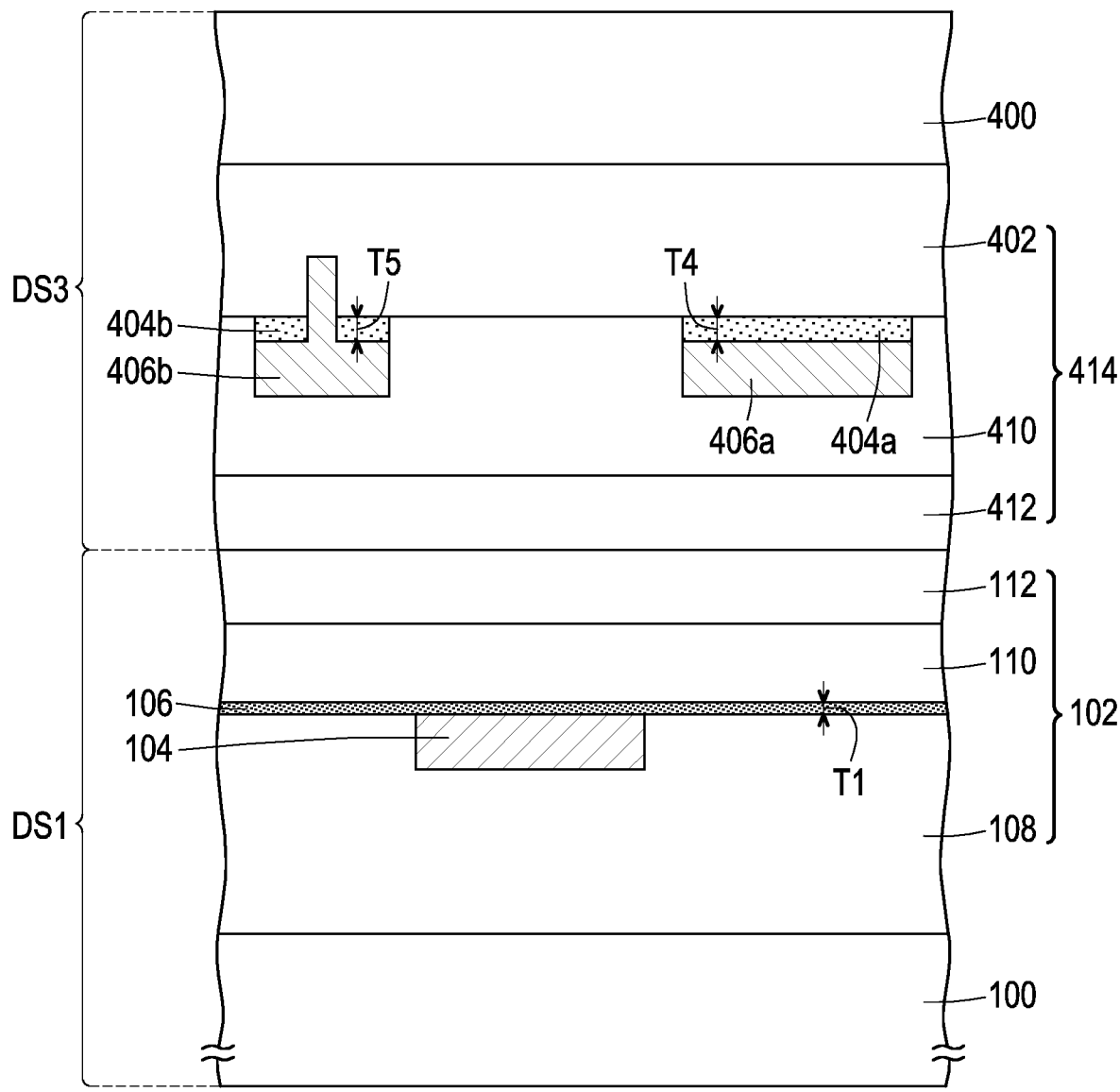

Referring to FIG. 2F, the device structure DS3 is provided on the device structure DS1. In some embodiments, the method of providing the device structure DS3 on the device structure DS1 may include bonding the dielectric structure 414 to the dielectric structure 102. In some embodiments, a method of bonding the dielectric structure 414 to the dielectric structure 102 may include bonding the passivation layer 412 to the passivation layer 112. In some embodiments, the method of bonding the passivation layer 412 to the passivation layer 112 is, for example, a fusion bonding method.

Figure 2G:
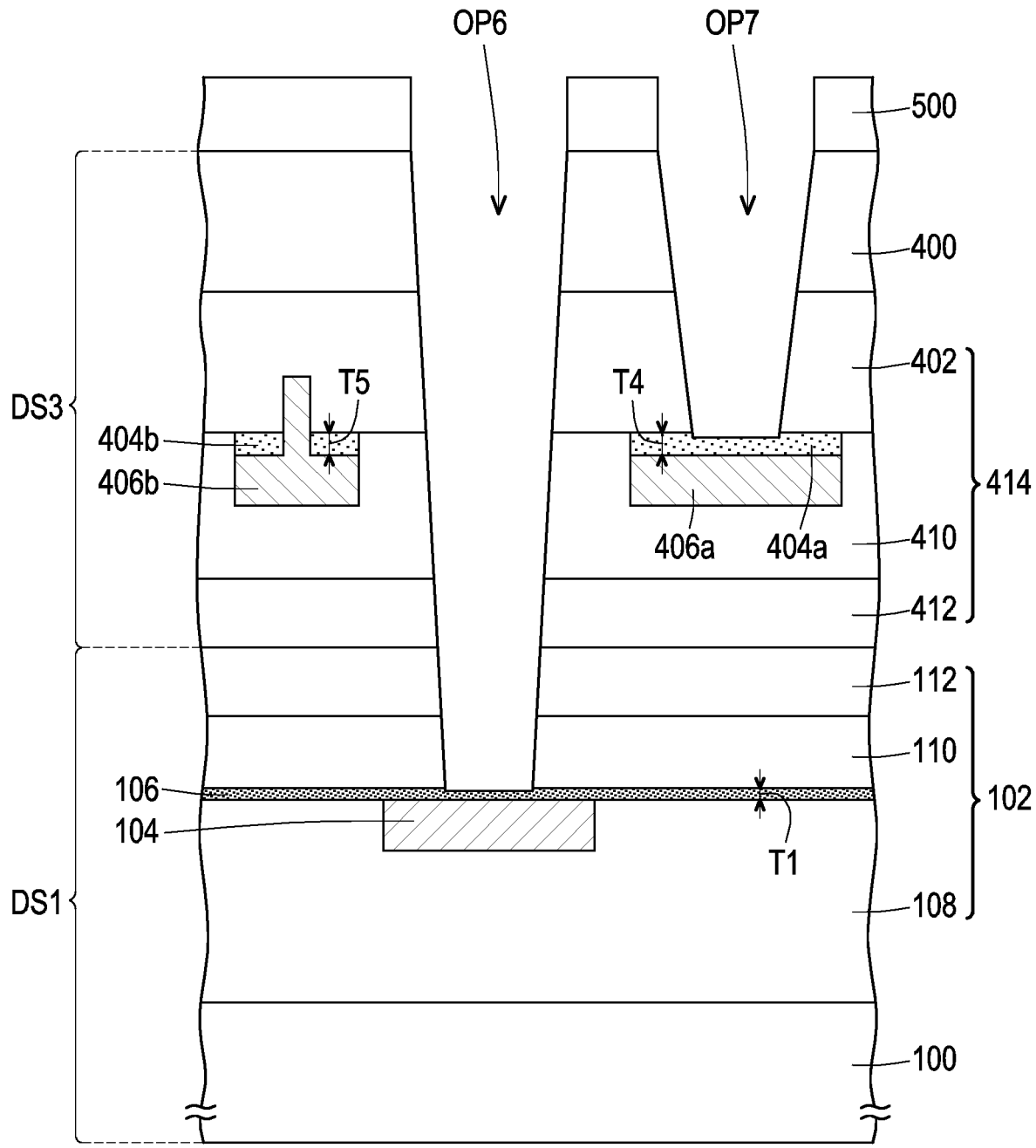

Referring to FIG. 2G, a patterned photoresist layer 500 may be formed on the substrate 400. In some embodiments, the patterned photoresist layer 500 may be formed by a lithography process.

A dry etching process may be performed on the substrate 400, the dielectric structure 414, and the dielectric structure 102 by using the patterned photoresist layer 500 as a mask to form an opening OP6 exposing the capping layer 106, and the dry etching process may be performed on the substrate 400 and the dielectric structure 414 by using the patterned photoresist layer 500 as a mask to form an opening OP7 exposing the stop layer 404a. Therefore, the opening OP6 exposing the capping layer 106 may be formed in the substrate 400, the dielectric structure 414, and the dielectric structure 102, and the opening OP7 exposing the stop layer 404a may be formed in the substrate 400 and the dielectric structure 414. In some embodiments, the opening OP6 and the opening OP7 may be formed by the same dry etching process. In the dry etching process, the capping layer 106 and the stop layer 404a may be used as etching stop layers, and the thickness T4 of the stop layer 404a is greater than the thickness T1 of the capping layer 106. Therefore, in the dry etching process, the landing pad 104 and the landing pad 406a can be prevented from being exposed to the plasma, thereby effectively preventing the antenna effect.

Figure 2H:
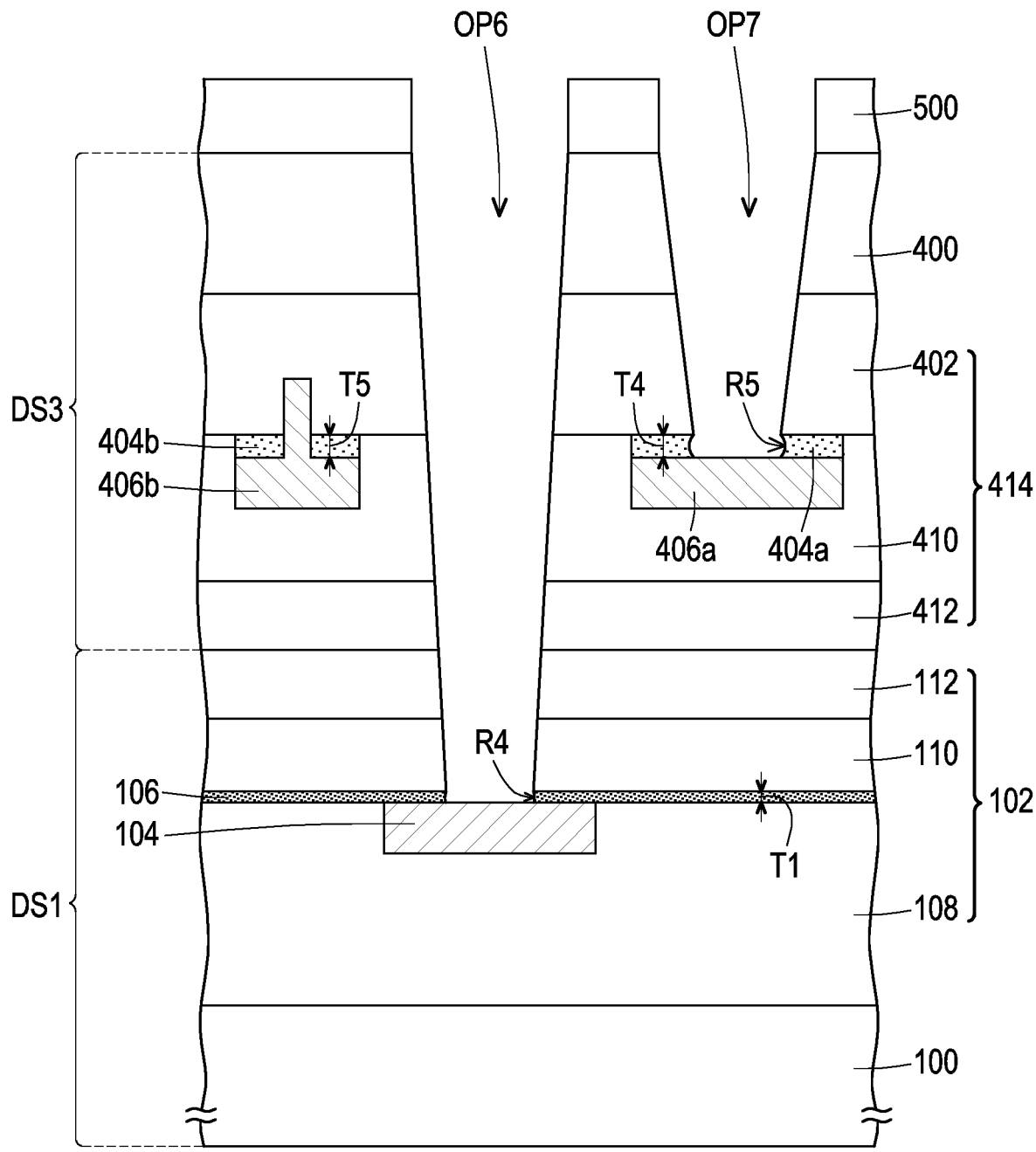

Referring to FIG. 2H, a portion of the capping layer 106 may be removed so that the opening OP6 exposes the landing pad 104, and a portion of the stop layer 404a may be removed so that the opening OP7 exposes the landing pad 406a. In the present embodiment, the method of removing the portion of the capping layer 106 and the portion of the stop layer 404a may include performing a wet etching process on the portion of the capping layer 106 exposed by the opening OP6 and the portion of the stop layer 404a exposed by the opening OP7. In the present embodiment, the portion of the capping layer 106 and the portion of the stop layer 404a are removed by the wet etching process, so the antenna effect will not be generated in the process of removing the portion of the capping layer 106 and the portion of the stop layer 404a. In the present embodiment, after performing the wet etching process, the capping layer 106 exposed by the opening OP6 may have a recess R4, and the stop layer 404a exposed by the opening OP7 may have a recess R5.

In other embodiments, the method of removing the portion of the capping layer 106 and the portion of the stop layer 404a may include performing a dry etching process on the portion of the capping layer 106 exposed by the opening OP6 and the portion of the stop layer 404a exposed by the opening OP7. In other embodiments, although not shown in the figure, when the portion of the capping layer 106 and the portion of the stop layer 404a are removed by the dry etching process, the capping layer 106 may not have the recess R4, and the stop layer 404a may not have the recess R5.

Figure 2I:
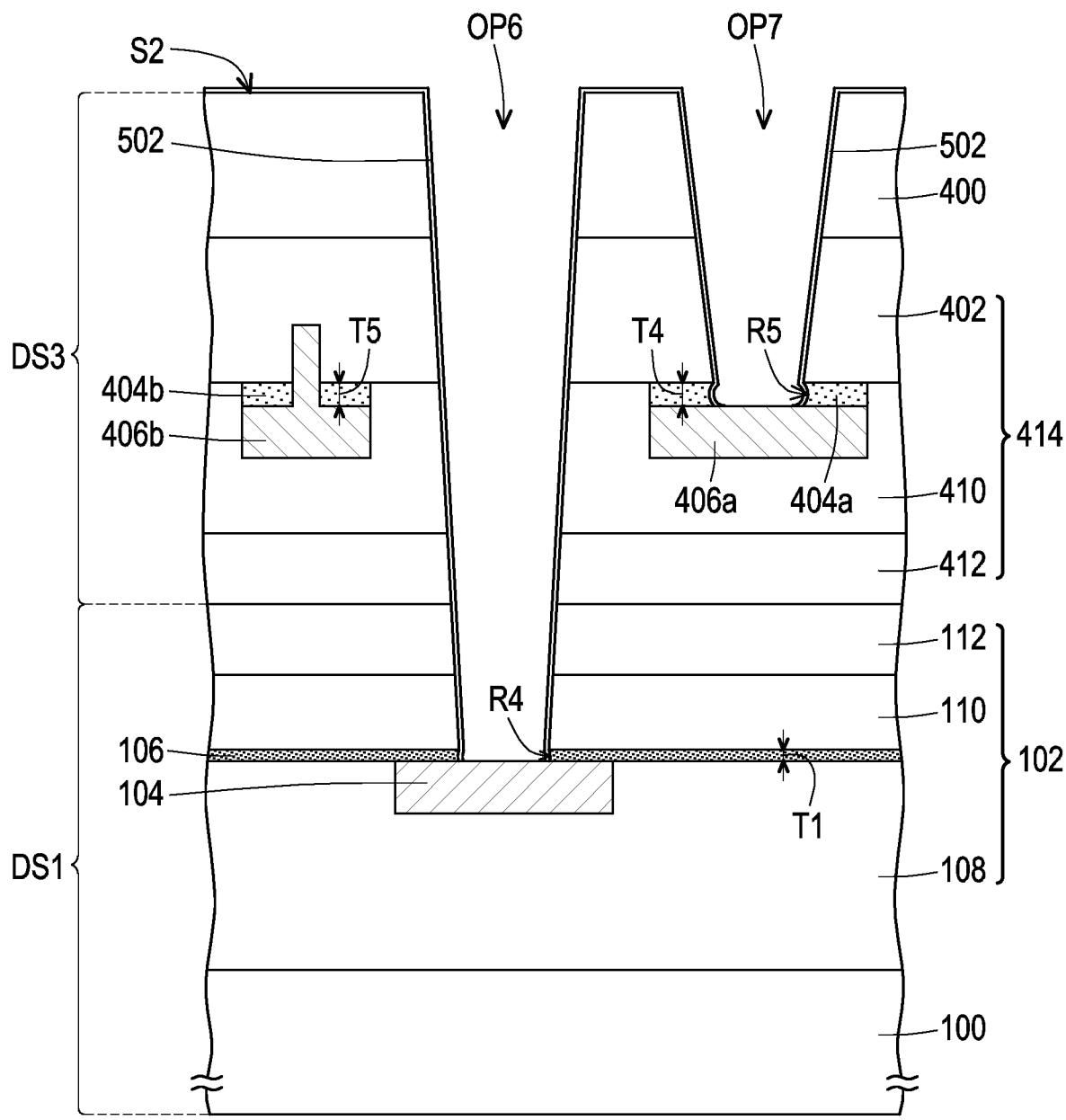

Referring to FIG. 2I, the patterned photoresist layer 500 may be removed. In some embodiments, the method of removing the patterned photoresist layer 500 is, for example, a dry stripping method or a wet stripping method.

A liner dielectric layer 502 may be formed on the sidewall of the opening OP6 and the sidewall of the opening OP7. The liner dielectric layer 502 may expose the landing pad 104 and the landing pad 406a. In some embodiments, the material of the liner dielectric layer 502 is, for example, silicon oxide. In some embodiments, the method of forming the liner dielectric layer 502 may include the following steps. First, a liner dielectric material layer (not shown) may be conformally formed on the substrate 400 and in the opening OP6 and the opening OP7. In some embodiments, the method of forming the lining dielectric material layer is, for example, a CVD method. An etch-back process may be performed on the liner dielectric material layer to remove a portion of the liner dielectric material layer located at the bottom of the opening OP6 and a portion of the liner dielectric material layer located at the bottom of the opening OP7 to form the liner dielectric layer 502. In some embodiments, the etch-back process is, for example, a dry etching process. In some embodiments, the liner dielectric layer 502 may be further located on the surface S2 of the substrate 400. In some embodiments, the liner dielectric layer 502 may be further located in the recess R4 of the capping layer 106 and the recess R5 of the stop layer 404a.

Figure 2J:
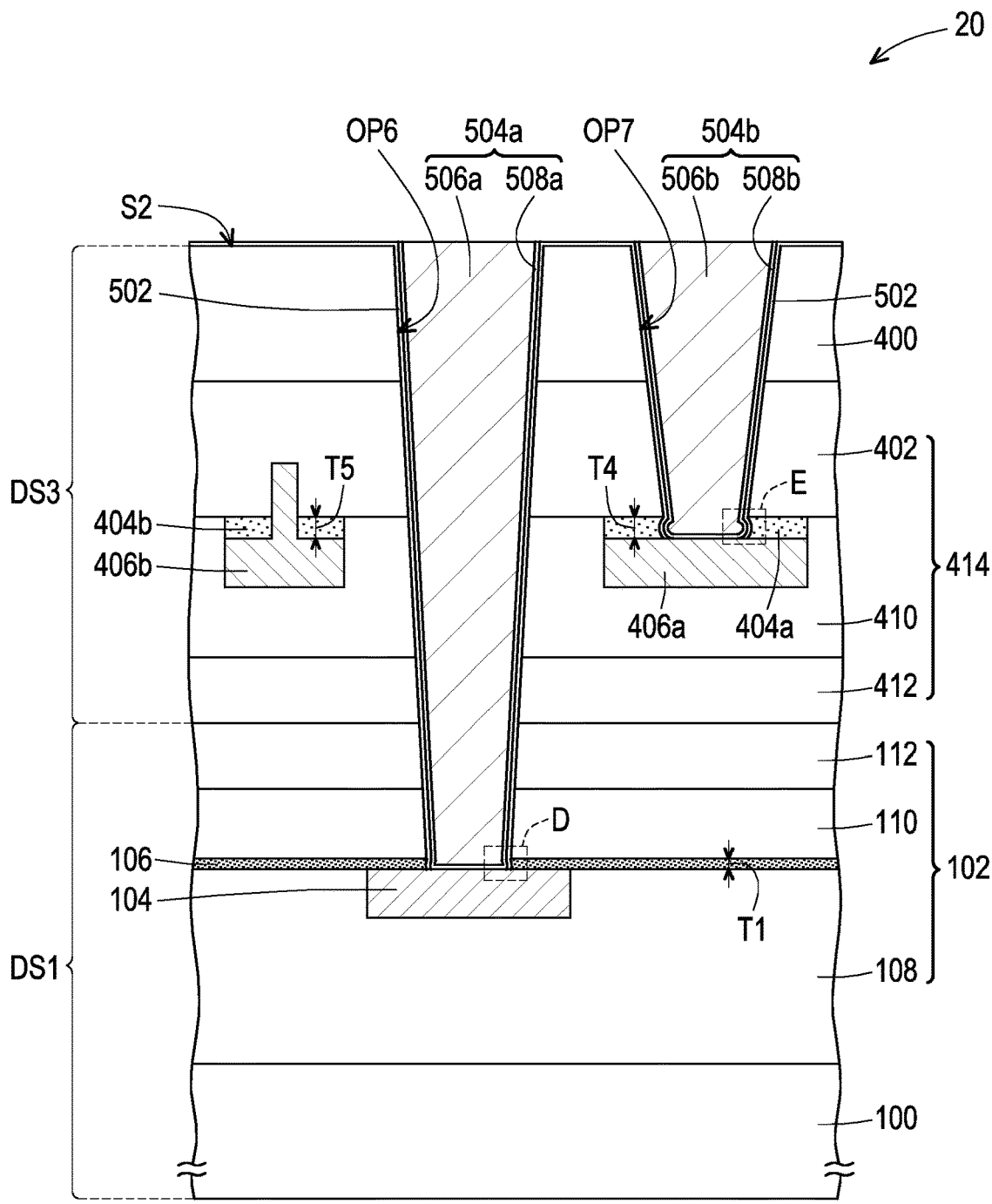
Figure 2J:

Referring to FIG. 2J, a TSV structure 504a may be formed in the opening OP6, and a TSV structure 504b may be formed in the opening OP7. The TSV structure 504a is disposed in the substrate 400, the dielectric structure 414, and the dielectric structure 102. The TSV structure 504a passes through the capping layer 106 and is electrically connected to the landing pad 104. The TSV structure 504b is disposed in the substrate 400 and the dielectric structure 414. The TSV structure 504b passes through the stop layer 404a and is electrically connected to the landing pad 406a. In the present embodiment, the TSV structure 504a may have a protruding portion P4 protruding toward the recess R4, and the TSV structure 504*b* may have a protruding portion P5 protruding toward the recess R5.

The TSV structure 504*a* and the TSV structure 504*b* may be single-layer structures or multilayer structures. In the present embodiment, the TSV structure 504*a* and the TSV structure 504*b* are, for example, multilayer structures, but the invention is not limited thereto. In some embodiments, the TSV structure 504*a* may include a TSV 506*a* and a barrier layer 508*a*. The TSV 506*a* is located in the opening OP6. The barrier layer 508*a* may be located between the TSV 506*a* and the liner dielectric layer 502 and between the TSV 506*a* and the landing pad 104. In some embodiments, the TSV structure 504*b* may include a TSV 506*b* and a barrier layer 508*b*. The TSV 506*b* is located in the opening OP7. The barrier layer 508*b* may be located between the TSV 506*b* and the liner dielectric layer 502 and between the TSV 506*b* and the landing pad 406*a*. In some embodiments, the materials of the TSV 506*a* and the TSV 506*b* are conductive materials such as copper. In some embodiments, the materials of the barrier layer 508*a* and the barrier layer 508*b* are, for example, tantalum, tantalum nitride, or a combination thereof.

In some embodiments, the method of forming the TSV structure 504*a* and the TSV structure 504*b* may include the following steps. First, a barrier material layer (not shown) may be conformally formed in the opening OP6 and the opening OP7. In some embodiments, the barrier material layer may be formed on the liner dielectric layer 502, a portion of the landing pad 104, and a portion of the landing pad 406*a*. In some embodiments, the method of forming the barrier material layer is, for example, a PVD method or a CVD method. Then, a TSV material layer (not shown) may be formed on the barrier material layer. The TSV material layer may fill the opening OP6 and the opening OP7. In some embodiments, the method of forming the TSV material layer is, for example, an electroplating method. Then, a portion of the TSV material layer and a portion of the barrier material layer located outside the opening OP6 and outside the opening OP7 may be removed to form the TSV 506*a*, the TSV 506*b*, the barrier layer 508*a*, and the barrier layer 508*b*. Therefore, the TSV structure 504*a* may be formed in the opening OP6, and the TSV structure 504*b* may be formed in the opening OP7. In some embodiments, the method of removing the portion of the TSV material layer and the portion of the barrier material layer located outside the opening OP6 and outside the opening OP7 is, for example, a CMP method.

Hereinafter, the semiconductor structure 20 of the above embodiments will be described with reference to FIG. 2J. In addition, although the method for forming the semiconductor structure 20 is described by taking the above method as an example, the invention is not limited thereto.

Referring to FIG. 2J, the semiconductor structure 20 includes a device structure DS1, a device structure DS3, a TSV structure 504*a*, and a TSV structure 504*b*. The device structure DS1 includes a substrate 100, a dielectric structure 102, a landing pad 104, and a capping layer 106. The dielectric structure 102 is disposed on the substrate 100. The landing pad 104 is disposed in the dielectric structure 102. The capping layer 106 is disposed in the dielectric structure 102 and on the landing pad 104. In some embodiments, the landing pad 104 may be located between the capping layer 106 and the substrate 100.

The device structure DS3 is disposed on the device structure DS1. The device structure DS3 includes a substrate 400, a dielectric structure 414, a stop layer 404*a*, and a landing pad 406*a*. The dielectric structure 414 is disposed on the substrate 400. In some embodiments, the dielectric structure 414 may be bonded to dielectric structure 102. The stop layer 404*a* is disposed in the dielectric structure 414. The thickness T4 of the stop layer 404*a* is greater than the thickness T1 of the capping layer 106. In some embodiments, the thickness T4 of the stop layer 404*a* may be 2 to 5 times the thickness T1 of the capping layer 106. The landing pad 406*a* is disposed in the dielectric structure 414 and on the stop layer 404*a*. In some embodiments, the stop layer 404*a* may be located between the landing pad 406*a* and the substrate 400.

In some embodiments, the device structure DS3 may further include a stop layer 404*b*. The stop layer 404*b* is disposed in the dielectric structure 414. In some embodiments, the thickness T5 of the stop layer 404*b* may be greater than the thickness T1 of the capping layer 106. In some embodiments, the thickness T5 of the stop layer 404*b* may be 2 times to 5 times the thickness T1 of the capping layer 106.

In some embodiments, the device structure DS3 may further include a conductive layer 406*b*. The conductive layer 406*b* is disposed in the dielectric structure 414 and on the stop layer 404*b*. In some embodiments, the stop layer 404*b* may be located between the conductive layer 406*b* and the substrate 400.

The TSV structure 504*a* is disposed in the substrate 400, the dielectric structure 414, and the dielectric structure 102. The TSV structure 504*a* passes through the capping layer 106 and is electrically connected to the landing pad 104. The TSV structure 504*b* is disposed in the substrate 400 and the dielectric structure 414. The TSV structure 504*b* passes through the stop layer 404*a* and is electrically connected to the landing pad 406*a*.

In some embodiments, the TSV structure 504*a* may have a protruding portion P4. The protruding portion P4 may protrude toward the capping layer 106. In some embodiments, TSV structure 504*b* may have a protruding portion P5. The protruding portion P5 may protrude toward the stop layer 404*a*.

In some embodiments, the semiconductor structure 20 may further include a liner dielectric layer 502. The liner dielectric layer 502 is located between the TSV structure 504*a* and the substrate 400, between the TSV structure 504*a* and the dielectric structure 414, between the TSV structure 504*a* and the dielectric structure 102, between the TSV structure 504*a* and the capping layer 106, between the TSV structure 504*b* and the substrate 400, between the TSV structure 504*b* and the dielectric structure 414, and between the TSV structure 504*b* and the stop layer 404*a*.

In addition, the details (e.g., the material and the forming method) of each component in the semiconductor structure 20 have been described in detail in the above embodiments, and the description thereof is not repeated here.

Based on the above embodiments, in the semiconductor structure 20 and the manufacturing method thereof, the TSV structure 504*a* is disposed in the substrate 400, the dielectric structure 414, and the dielectric structure 102. The TSV structure 504*a* passes through the capping layer 106 and is electrically connected to the landing pad 104. The TSV structure 504*b* is disposed in the substrate 400 and the dielectric structure 414. The TSV structure 504*b* passes through the stop layer 404*a* and is electrically connected to the landing pad 406*a*. In addition, the thickness T4 of the stop layer 404*a* is greater than the thickness T1 of the capping layer 106. Therefore, in the process of forming the openings (e.g., opening OP6 and opening OP7) for accommodating the TSV structure 504*a* and the TSV structure 504b, the antenna effect can be effectively prevented or reduced. In this way, the antenna effect can be prevented from damaging the semiconductor device in the semiconductor structure 20, thereby improving the yield and reliability of the product.

In summary, in the semiconductor structure and the manufacturing method thereof of the aforementioned embodiments, the antenna effect can be effectively prevented or reduced in the process of forming the openings for accommodating the TSV structures. In this way, the antenna effect can be prevented from damaging the semiconductor device in the semiconductor structure, thereby improving the yield and reliability of the product.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
    a first device structure comprising:
       a first substrate;
       a first dielectric structure disposed on the first substrate;
       a first landing pad disposed in the first dielectric structure; and
       a first capping layer disposed in the first dielectric structure and on the first landing pad;
    a second device structure disposed on the first device structure and comprising:
       a second substrate;
       a second dielectric structure disposed on the second substrate;
       a stop layer disposed in the second dielectric structure, wherein a thickness of the stop layer is greater than a thickness of the first capping layer; and
       a second landing pad disposed in the second dielectric structure and on the stop layer;
    a first through-substrate via (TSV) structure disposed in the second substrate, the second dielectric structure, and the first dielectric structure, passing through the first capping layer, and being electrically connected to the first landing pad; and
    a second TSV structure disposed in the second substrate and the second dielectric structure, passing through the stop layer, and being electrically connected to the second landing pad.

2. The semiconductor structure according to claim 1, wherein the thickness of the stop layer is 2 to 5 times the thickness of the first capping layer.

3. The semiconductor structure according to claim 1, wherein the second dielectric structure is bonded to the first dielectric structure.

4. The semiconductor structure according to claim 1, wherein
    the first landing pad is located between the first capping layer and the first substrate, and
    the stop layer is located between the second landing pad and the second substrate.

5. The semiconductor structure according to claim 1, wherein
    the first TSV structure has a protruding portion, and the protruding portion protrudes toward the first capping layer.

6. The semiconductor structure according to claim 1, wherein
    the second TSV structure has a protruding portion, and the protruding portion protrudes toward the stop layer.

7. The semiconductor structure according to claim 1, wherein the second device structure further comprises:
    a second capping layer disposed in the second dielectric structure and on the second landing pad.

8. The semiconductor structure according to claim 7, wherein the second landing pad is located between the second capping layer and the second substrate.

9. The semiconductor structure according to claim 7, wherein the thickness of the stop layer is greater than a thickness of the second capping layer.

10. The semiconductor structure according to claim 7, wherein the thickness of the stop layer is 2 to 5 times a thickness of the second capping layer.

11. The semiconductor structure according to claim 7, wherein the first TSV structure has a protruding portion, and the protruding portion protrudes toward the second capping layer.

12. The semiconductor structure according to claim 1, further comprising:
    a liner dielectric layer located between the first TSV structure and the second substrate, between the first TSV structure and the second dielectric structure, between the first TSV structure and the first dielectric structure, between the first TSV structure and the first capping layer, between the second TSV structure and the second substrate, between the second TSV structure and the second dielectric structure, and between the second TSV structure and the stop layer.

13. A manufacturing method of a semiconductor structure, comprising:
    providing a first device structure, wherein the first device structure comprises:
       a first substrate;
       a first dielectric structure disposed on the first substrate;
       a first landing pad disposed in the first dielectric structure; and
       a capping layer disposed in the first dielectric structure and on the first landing pad;
    providing a second device structure on the first device structure, wherein the second device structure comprises:
       a second substrate;
       a second dielectric structure disposed on the second substrate;
       a stop layer disposed in the second dielectric structure, wherein a thickness of the stop layer is greater than a thickness of the capping layer; and
       a second landing pad disposed in the second dielectric structure and on the stop layer;
    forming a first TSV structure, wherein the first TSV structure is disposed in the second substrate, the second dielectric structure, and the first dielectric structure, passes through the capping layer, and is electrically connected to the first landing pad; and
    forming a second TSV structure, wherein the second TSV structure is disposed in the second substrate and the second dielectric structure, passes through the stop layer, and is electrically connected to the second landing pad.

14. The manufacturing method of the semiconductor structure according to claim 13, wherein a method of providing the second device structure on the first device structure comprises bonding the second dielectric structure to the first dielectric structure.

15. The manufacturing method of the semiconductor structure according to claim 13, wherein a method of forming the first TSV structure and the second TSV structure comprises:
- forming a first opening exposing the capping layer in the second substrate, the second dielectric structure, and the first dielectric structure and forming a second opening exposing the stop layer in the second substrate and the second dielectric structure;
- removing a portion of the capping layer so that the first opening exposes the first landing pad and removing a portion of the stop layer so that the second opening exposes the second landing pad; and
- forming the first TSV structure in the first opening and forming the second TSV structure in the second opening.

16. The manufacturing method of the semiconductor structure according to claim 15, wherein a method of forming the first opening and the second opening comprises:
- forming a patterned photoresist layer on the second substrate; and
- performing a dry etching process on the second substrate, the second dielectric structure, and the first dielectric structure by using the patterned photoresist layer as a mask to form the first opening exposing the capping layer and performing the dry etching process on the second substrate and the second dielectric structure by using the patterned photoresist layer as a mask to form the second opening exposing the stop layer.

17. The manufacturing method of the semiconductor structure according to claim 15, wherein a method of removing the portion of the capping layer and the portion of the stop layer comprises performing a wet etching process on the portion of the capping layer exposed by the first opening and the portion of the stop layer exposed by the second opening.

18. The manufacturing method of the semiconductor structure according to claim 17, wherein
- after performing the wet etching process, the capping layer exposed by the first opening has a first recess, and the stop layer exposed by the second opening has a second recess,
- the first TSV structure has a first protruding portion protruding toward the first recess, and
- the second TSV structure has a second protruding portion protruding toward the second recess.

19. The manufacturing method of the semiconductor structure according to claim 15, wherein a method of removing the portion of the capping layer and the portion of the stop layer comprises performing a dry etching process on the portion of the capping layer exposed by the first opening and the portion of the stop layer exposed by the second opening.

20. The manufacturing method of the semiconductor structure according to claim 13, further comprising:
- forming a liner dielectric layer on a sidewall of the first opening and a sidewall of the second opening before forming the first TSV structure and the second TSV structure.

\* \* \* \* \*